US011186757B2

(12) United States Patent
Arimoto et al.

(10) Patent No.: US 11,186,757 B2
(45) Date of Patent: Nov. 30, 2021

(54) RESIN COMPOSITION, RESIN LAYER, PERMANENT ADHESIVE, ADHESIVE FOR TEMPORARY BONDING, LAMINATED FILM, PROCESSED WAFER, AND METHOD FOR MANUFACTURING ELECTRONIC COMPONENT OR SEMICONDUCTOR DEVICE

(71) Applicant: Toray Industries, Inc., Tokyo (JP)

(72) Inventors: Shinji Arimoto, Otsu (JP); Takenori Fujiwara, Otsu (JP); Toru Okazawa, Otsu (JP)

(73) Assignee: TORAY INDUSTRIES, INC., Tokyo (JP)

(*) Notice: Subject to any disclaimer, the term of this patent is extended or adjusted under 35 U.S.C. 154(b) by 627 days.

(21) Appl. No.: 16/074,187

(22) PCT Filed: Feb. 3, 2017

(86) PCT No.: PCT/JP2017/003927
§ 371 (c)(1),
(2) Date: Jul. 31, 2018

(87) PCT Pub. No.: WO2017/138447
PCT Pub. Date: Aug. 17, 2017

(65) Prior Publication Data
US 2021/0139700 A1    May 13, 2021

(30) Foreign Application Priority Data

Feb. 8, 2016  (JP) .............................. JP2016-021570

(51) Int. Cl.
| C09J 179/08 | (2006.01) |
| C08G 77/18 | (2006.01) |
| C08G 77/20 | (2006.01) |
| C08G 77/26 | (2006.01) |
| C08K 3/36 | (2006.01) |
| C08K 5/1539 | (2006.01) |
| C08L 63/00 | (2006.01) |
| C08L 79/08 | (2006.01) |
| C09J 11/06 | (2006.01) |
| C08G 73/10 | (2006.01) |
| C09J 183/14 | (2006.01) |
| C08G 77/455 | (2006.01) |
| H01L 21/683 | (2006.01) |

(52) U.S. Cl.
CPC .......... C09J 179/08 (2013.01); C08G 73/106 (2013.01); C08G 77/18 (2013.01); C08G 77/20 (2013.01); C08G 77/26 (2013.01); C08G 77/455 (2013.01); C08K 3/36 (2013.01); C08K 5/1539 (2013.01); C08L 63/00 (2013.01); C08L 79/08 (2013.01); C09J 11/06 (2013.01); C09J 183/14 (2013.01); H01L 21/6836 (2013.01); C08G 2170/00 (2013.01); C08L 2201/08 (2013.01); C08L 2203/20 (2013.01); C08L 2205/03 (2013.01); C08L 2312/00 (2013.01); C09J 2203/326 (2013.01); C09J 2301/16 (2020.08)

(58) Field of Classification Search
CPC ......... C08L 79/00; C08L 79/08; C09J 179/00; C09J 179/08; C08G 77/26; C08G 77/455; B32B 7/06; B32B 7/12
See application file for complete search history.

(56) References Cited

U.S. PATENT DOCUMENTS

| 8,889,557 | B2 | 11/2014 | Yamaguchi et al. |
| 9,653,335 | B2 | 5/2017 | Kato et al. |
| 9,881,829 | B2 | 1/2018 | Yoshioka et al. |
| 9,884,979 | B2* | 2/2018 | Yasuda ..................... C09J 5/00 |
| 2010/0056730 | A1 | 3/2010 | Yoneda et al. |

(Continued)

FOREIGN PATENT DOCUMENTS

| JP | 2008139862 A | 6/2008 |
| JP | 2010053223 A | 3/2010 |

(Continued)

OTHER PUBLICATIONS

"Synthesis and Characterization of an Epoxy Resin Containing Fluorene Moieties and its Cured Polymer" authored by Lu et al. and published in Pigment & Resin Technology (2008) 37(6) 389-394.*
Machine translation of JP 2012-162676 (no date).*
International Search Report and Written Opinion for International Application No. PCT/JP2017/003927, dated Mar. 21, 2017—8 pages.
Taiwan Search Report for Taiwan Application No. 106103889, dated Jan. 18, 2021, 1 page.

*Primary Examiner* — Marc S Zimmer
(74) *Attorney, Agent, or Firm* — RatnerPrestia

(57) ABSTRACT

A resin composition contains at least (a) a polyimide resin having a specific structure and (b) a crosslinker including a fluorene group. The resin composition is capable of bonding an electronic circuit formation substrate or a semiconductor circuit formation substrate and a support substrate together. The resin composition has excellent heat resistance during bonding of an electronic circuit formation substrate or semiconductor circuit formation substrate having a thickness of 1 μm or more and 100 μm or less. The resin composition has steady adhesive force through the process of manufacturing an electronic component, a semiconductor device or the like, and can be peeled off under mild conditions at room temperature after the manufacturing process. An adhesive, a resin layer, a laminated film, and a processed wafer containing the resin composition, as well as a method for manufacturing an electronic component or a semiconductor device using these are also disclosed.

25 Claims, No Drawings

(56) References Cited

U.S. PATENT DOCUMENTS

| | | |
|---|---|---|
| 2013/0245160 A1 | 9/2013 | Shimada et al. |
| 2015/0299534 A1* | 10/2015 | Yoshioka ................. B32B 7/12 156/712 |
| 2015/0318227 A1 | 11/2015 | Shimada et al. |
| 2017/0154801 A1* | 6/2017 | Tagami .................. C09J 183/10 |
| 2018/0281361 A1* | 10/2018 | Oda ......................... B32B 7/12 |

FOREIGN PATENT DOCUMENTS

| | | |
|---|---|---|
| JP | 2010254808 A | 11/2010 |
| JP | 2012162676 A | 8/2012 |
| JP | 2013048215 A | 3/2013 |
| JP | 2013241568 A | 12/2013 |
| JP | 2015214675 A | 12/2015 |
| JP | 2016020471 A | 2/2016 |
| TW | 201233762 a | 8/2012 |
| WO | 2014115637 A1 | 7/2014 |
| WO | WO 2017/073507 A1 * | 5/2017 |

* cited by examiner

RESIN COMPOSITION, RESIN LAYER, PERMANENT ADHESIVE, ADHESIVE FOR TEMPORARY BONDING, LAMINATED FILM, PROCESSED WAFER, AND METHOD FOR MANUFACTURING ELECTRONIC COMPONENT OR SEMICONDUCTOR DEVICE

CROSS REFERENCE TO RELATED APPLICATIONS

This is the U.S. National Phase application of PCT/JP2017/003927, filed Feb. 3, 2017, which claims priority to Japanese Patent Application No. 2016-021570, filed Feb. 8, 2016, the disclosures of these applications being incorporated herein by reference in their entireties for all purposes.

TECHNICAL FIELD OF THE INVENTION

The present invention relates to a resin composition, a resin layer, a permanent adhesive, an adhesive for temporary bonding, a laminated film, a processed wafer, and a method for manufacturing an electronic component or a semiconductor device.

BACKGROUND OF THE INVENTION

In recent years, substrates have been thinned in order to reduce the weight and thickness of an electronic component and a semiconductor device. A thin substrate is used in a processed wafer in which the thin substrate is fixed to a supportive support substrate such as a silicon substrate, a glass substrate, and a film with an adhesive for temporary bonding because a thin substrate warps largely, is difficult to form a circuit, and cracks and breaks easily. When the processed wafer is subjected to a heat treatment such as circuit formation processing, the adhesive for temporary bonding is required to have heat resistance enough to withstand the heat treatment.

For example, in an electronic component, a capacitor or the like is required to be thinned. To solve such a problem, an electronic circuit formation substrate is required to be thinned, and thus, investigations have been made to reduce the thickness of an electronic circuit formation substrate to 1 μm or more and 100 μm or less. Because an electronic circuit formation substrate having a thickness of 1 μm or more and 100 μm or less warps largely and is difficult to form a circuit, the electronic circuit formation substrate is fixed to a supportive support substrate such as a silicon substrate, a glass substrate, and a film to form a processed wafer, and is subjected to the circuit formation processing, and then the electronic circuit formation substrate on which a circuit is formed is peeled off. An adhesive for temporary bonding is used as a bonding layer to fix the electronic circuit formation substrate to a support substrate. After a step of peeling the electronic circuit formation substrate from the support substrate, the adhesive layer remaining on the electronic circuit formation substrate and the support substrate as well as the residue of the adhesive layer may be reworked with an organic solvent or an alkaline aqueous solution.

The adhesive for temporary bonding used in the manufacture of an electronic component is required to have heat resistance enough to withstand the circuit forming step, and in particular, is required to have heat resistance enough to withstand the circuit forming step in an electronic circuit formation substrate having a thickness of 1 μm or more and 100 μm or less. The adhesive for temporary bonding is required to be easily peeled off after the completion of the circuit forming step.

In a semiconductor device, techniques of laminating semiconductor chips with the semiconductor chips connected with a through-silicon via (TSV) have been developed in order to achieve higher levels of integration and higher packaging density of a semiconductor device. In the field of power semiconductors, reduction of conduction loss is required for energy saving. In order to achieve such an object, the thickness of the package has to be reduced. Thus, investigations have been made to reduce the thickness of a semiconductor circuit formation substrate to 1 μm or more and 100 μm or less. A surface of the semiconductor circuit formation substrate not having a circuit (a backside) is polished to be thinned, and a back electrode is formed on the backside. In order to prevent cracking of the semiconductor circuit formation substrate during processes such as polishing, back circuit formation processing and the like, the semiconductor circuit formation substrate is fixed to a supportive support substrate such as a silicon substrate, a glass substrate, and a film to form a processed wafer, and is subjected to polishing, back circuit formation processing and the like, and then the polished and back circuit formation-processed semiconductor circuit formation substrate is peeled from the support substrate. For fixing the semiconductor circuit formation substrate to the support substrate, an adhesive for temporary bonding is used as an adhesive layer. After the step of peeling the semiconductor circuit formation substrate from the support substrate, the adhesive layer remaining on the semiconductor circuit formation substrate and the support substrate as well as the residue of the adhesive layer may be reworked with an organic solvent or an alkaline aqueous solution.

The adhesive for temporary bonding used in manufacture of the semiconductor device is required to have heat resistance enough to withstand polishing and the backside circuit forming step, and in particular, is required to have heat resistance enough to withstand the backside circuit forming step after polishing and thinning of the surface not having a circuit (a backside) of the semiconductor circuit formation substrate. The adhesive for temporary bonding is required to be easily peeled off after the completion of polishing and the backside circuit forming step.

As such an adhesive for temporary bonding, for example, there has been proposed an adhesive which produces a polyamide- or polyimide-based heat-resistant bonding layer, and which is peeled off by being heated to change the adhesive force (see, for example, Patent Document 1). There has also been proposed an adhesive for temporary bonding which produces a structure including two types of adhesive layers, that is, a heat-resistant thermoplastic organopolysiloxane-based adhesive layer and a heat-resistant curable modified siloxane-based adhesive layer, which has an adhesive force that makes the adhesive layer peelable from both a semiconductor circuit formation substrate and a support substrate, and which is peeled off by a mechanical force applied at room temperature (for example, Patent Document 2). There has also been proposed an adhesive for temporary bonding which produces one type of an adhesive layer, that is, a cycloolefin- or elastomer-based adhesive layer, and is peeled off by a mechanical force applied at room temperature (for example, Patent Documents 3 and 4).

PATENT DOCUMENTS

Patent Document 1: Japanese Patent Laid-Open formed, which imposes a considerable burden on the process. The adhesives for temporary bonding as in Patent Document 3 and 4 produce one type of an adhesive layer and are peeled off by a mechanical force applied at room temperature. However, they have problems that cycloolefin- and elastomer-based materials decompose during the electronic circuit forming step or the semiconductor circuit forming step at high temperatures.

In view of such a situation, an object of the present invention is to provide a resin composition that is capable of bonding an electronic circuit formation substrate or a semiconductor circuit formation substrate and a support substrate together, has excellent heat resistance during bonding of an electronic circuit formation substrate or semiconductor circuit formation substrate having a thickness of 1 μm or more and 100 μm or less, has steady adhesive force through the process of manufacturing an electronic component, a semiconductor device or the like, and can be peeled off under mild conditions at room temperature after the manufacturing process, an adhesive, a resin layer, a laminated film, and a processed wafer containing the resin composition, as well as a method for manufacturing an Publication No. 2010-254808 (Claims)

Patent Document 2: Japanese Patent Laid-Open Publication No. 2013-48215 (Claims)

Patent Document 3: Japanese Patent Laid-Open Publication No. 2013-241568 (Claims)

Patent Document 4: Japanese Patent Laid-Open Publication No. 2015-214675 (Claims)

SUMMARY OF THE INVENTION

However, the adhesive for temporary bonding as in Patent Document 1, which can be peeled off only by heating, has problems that the solder bump is dissolved during the heating step for peeling, that an adhesive force during the electronic circuit forming step or the semiconductor circuit forming step is reduced and the adhesive is peeled off during the step, or conversely an adhesive force is increased and the adhesive cannot be peeled off.

The adhesive for temporary bonding as in Patent Document 2, which is peeled off by a mechanical force applied at room temperature, is free from the above-mentioned problems. However, two types of adhesive layers have to be electronic component or a semiconductor device using these. The resin composition of the present invention can be used as a permanent adhesive or an adhesive for temporary bonding, and, in particular, can be suitably used as an adhesive for temporary bonding.

The present invention provides a resin composition containing at least (a) a polyimide resin including a structure represented by the general formula (1) and (b) a crosslinker including a fluorene group:

[Chemical Formula 1]

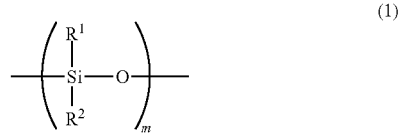

wherein m is a natural number of 1 or more and 100 or less, $R^1$ and $R^2$ may be same or different and each represent an alkyl group having 1 to 30 carbon atoms, a phenyl group, or a phenoxy group.

The present invention also provides a resin layer including a coating film of the resin composition of the present invention.

The present invention also provides a permanent adhesive containing the resin composition of the present invention.

The present invention also provides an adhesive for temporary bonding containing the resin composition of the present invention.

The present invention also provides a method for manufacturing an electronic component or a semiconductor device using the resin composition of the present invention.

The present invention also provides a laminated film including a heat-resistant insulating film and the resin composition of the present invention on at least one surface of the heat-resistant insulating film.

The present invention also provides a method for manufacturing an electronic component or a semiconductor device using the laminated film of the present invention.

The present invention also provides a processed wafer including an electronic circuit formation substrate or a semiconductor circuit formation substrate and a support substrate bonded together at least with the resin layer of the present invention or the laminated film of the present invention interposed between the electronic circuit formation substrate or the semiconductor circuit formation substrate and the support substrate.

The present invention also provides a method for manufacturing an electronic component or a semiconductor device using the processed wafer of the present invention, including at least either of the steps of:

heat-treating the electronic circuit formation substrate or the semiconductor circuit formation substrate in the processed wafer;

peeling the electronic circuit formation substrate or the semiconductor circuit formation substrate in the processed wafer from the support substrate; and washing the resin layer attached to the electronic circuit formation substrate or the semiconductor circuit formation substrate peeled from the processed wafer or the resin layer attached to the support substrate in the processed wafer with a solvent.

According to the present invention, there can be provided a resin composition that is capable of bonding an electronic circuit formation substrate or a semiconductor circuit formation substrate and a support substrate together, has excellent heat resistance during bonding of an electronic circuit formation substrate or semiconductor circuit formation substrate having a thickness of 1 μm or more and 100 μm or less, has steady adhesive force through the process of manufacturing an electronic component, a semiconductor device or the like, and can be peeled off under mild conditions at room temperature after the manufacturing process, an adhesive, a resin layer, a laminated film, and a processed wafer containing the resin composition, as well as a method for manufacturing an electronic component or a semiconductor device using these. The resin composition of the present invention can be used as a permanent adhesive or an adhesive for temporary bonding, and, in particular, can be suitably used as an adhesive for temporary bonding.

DETAILED DESCRIPTION OF EMBODIMENTS OF THE INVENTION

The present invention provides a resin composition containing at least (a) a polyimide resin including a structure represented by the general formula (1) and (b) a crosslinker including a fluorene group:

[Chemical Formula 2]

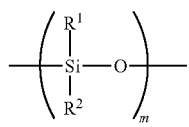

(1)

wherein m is a natural number of 1 or more and 100 or less, $R^1$ and $R^2$ may be same or different and each represent an alkyl group having 1 to 30 carbon atoms, a phenyl group, or a phenoxy group.

The polyimide resin (a) including the structure represented by the general formula (1) of the present invention will be described.

The polyimide resin (a) includes the structure represented by the general formula (1). The structure represented by the general formula (1) may be included in either a residue of an acid dianhydride or a residue of a diamine, but from the viewpoint of the solubility of the polyimide resin and from the viewpoint of cost, the structure represented by the general formula (1) is preferably included in the diamine residue as a residue of a polysiloxane diamine represented by the general formula (2):

[Chemical Formula 3]

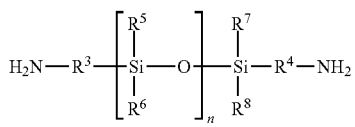

(2)

wherein n is an integer from 1 to 100, $R^3$ and $R^4$ may be same or different and each represent an alkylene group having 1 to 30 carbon atoms or a phenylene group, and $R^5$ to $R^8$ may be same or different and each represent an alkyl group having 1 to 30 carbon atoms, a phenyl group, or a phenoxy group.

The average molecular weight of the polysiloxane diamine can be determined by calculation of the amino group equivalent through neutralization titration of amino groups of the polysiloxane diamine, and doubling of the amino group equivalent. For example, a predetermined amount of a polysiloxane diamine serving as a sample is taken and put in a beaker, and dissolved in a predetermined amount of a 1:1 mixed solution of isopropyl alcohol (hereinafter referred to as IPA) and toluene. To the resulting solution, a 0.1 N aqueous hydrochloric acid solution is added dropwise with stirring, the amount of the 0.1 N aqueous hydrochloric acid solution added until the neutralization point is determined, and the amino group equivalent is calculated from the amount of the added aqueous solution. A value obtained by doubling of the amino group equivalent is the average molecular weight.

Meanwhile, a relationship between the value of n and the molecular weight of the polysiloxane diamine can be obtained as a relational expression of a linear function by calculation of the molecular weights of the polysiloxane diamine in the cases where n=1 and n=10 from the chemical structural formula. The average value of n can be determined by application of the average molecular weights to the relational expression.

Since the polysiloxane diamine represented by the general formula (2) is sometimes a mixture in which n is not a single value but has a plurality of values, n represents an average value in the present invention.

Specific examples of the polysiloxane diamine represented by the general formula (2) include α,ω-bis(3-aminopropyl)polydimethylsiloxane, α,ω-bis(3-aminopropyl) polydiethylsiloxane, α,ω-bis(3-aminopropyl) polydipropylsiloxane, α,ω-bis(3-aminopropyl) polydibutylsiloxane, α,ω-bis(3-aminopropyl) polydiphenoxysiloxane, α,ω-bis(2-aminoethyl) polydimethylsiloxane, α,ω-bis(2-aminoethyl) polydiphenoxysiloxane, α,ω-bis(4-aminobutyl) polydimethylsiloxane, α,ω-bis(4-aminobutyl) polydiphenoxysiloxane, α,ω-bis(5-aminopentyl) polydimethylsiloxane, α,ω-bis(5-aminopentyl) polydiphenoxysiloxane, α,ω-bis(4-aminophenyl) polydimethylsiloxane, and α,ω-bis(4-aminophenyl) polydiphenoxysiloxane. These polysiloxane diamines may be used singly, or two or more of them may be used. Among them, a polysiloxane diamine in which n is 2 or more is preferred, because the glass transition temperature of the polyimide resin can be lowered, and good adhesiveness can be exhibited when thermocompression bonding is performed.

The content of the residue of the polysiloxane diamine represented by the general formula (2) is preferably 30 mol % or more and 90 mol % or less, more preferably 40 mol % or more and 90 mol % or less in the total diamine residues. Within this range, the glass transition temperature of the polyimide resin is greatly lowered, and good adhesiveness can be obtained.

The polyimide resin may have a residue of an aromatic diamine or a residue of an alicyclic diamine. The content of the residue of the aromatic diamine or the residue of the alicyclic diamine is preferably 0.1 mol % or more and 70 mol % or less, more preferably 0.1 mol % or more and 60 mol % or less in the total diamine residues. Within this range, a polyimide resin having good adhesiveness and heat resistance can be obtained.

Specific examples of the aromatic diamine or the alicyclic diamine include 2,5-diaminophenol, 3,5-diaminophenol, 3,3'-dihydroxybenzidine, 4,4'-dihydroxy-3,3'-diaminophenyl propane, 4,4'-dihydroxy-3,3'-diaminophenyl hexafluoropropane, 4,4'-dihydroxy-3,3'-diaminophenyl sulfone, 4,4'-dihydroxy-3,3'-diaminophenyl ether, 3,3'-dihydroxy-4,4'-diaminophenyl ether, 4,4'-dihydroxy-3,3'-diaminophenyl propane methane, 4,4'-dihydroxy-3,3'-diaminobenzophenone, 1,3-bis(4-amino-3-hydroxy phenyl)benzene, 1,3-bis (3-amino-4-hydroxy phenyl)benzene, bis(4-(4-amino-3-hydroxy phenoxy)benzene)propane, bis(4-(3-amino-4-hydroxy phenoxy)benzene)sulfone, bis(4-(3-amino-4-hydroxy phenoxy))biphenyl, p-phenylene diamine, m-phenylene diamine, 2,5-diaminotoluene, 2,4-diaminotoluene, 3,5-diaminobenzoic acid, 2,6-diaminobenzoic acid, 2-methoxy-1,4-phenylene diamine, 4,4'-diaminobenzanilide, 3,4'-diaminobenzanilide, 3,3'-diaminobenzanilide, 3,3'-dimethyl-4,4'-diaminobenzanilide, 9,9-bis(4-aminophenyl)fluorene, 9,9-bis(3-aminophenyl)fluorene, 9,9-bis(3-methyl-4-aminophenyl)fluorene, 9,9-bis(3,5-dimethyl-4-aminophenyl)fluorene, 9,9-bis(3-methoxy-4-aminophenyl) fluorene, 9,9-bis(4-aminophenyl)fluorene-4-carboxylic acid, 9,9-bis(4-aminophenyl)fluorene-4-methyl, 9,9-bis(4-aminophenyl)fluorene-4-methoxy, 9,9-bis(4-aminophenyl)fluorene-4-ethyl, 9,9-bis(4-aminophenyl)fluorene-4-sulfone, 9,9-bis(4-aminophenyl)fluorene-3-carboxylic acid, 9,9-bis (4-aminophenyl)fluorene-3-methyl, 1,3-diaminocyclohexane, 2,2'-dimethyl benzidine, 3,3'-dimethyl benzidine, 3,3'-dimethoxy benzidine, 2,4-diaminopyridine, 2,6-diaminopyridine, 1,5-diaminonaphthalene, 2,7-diaminofluorene, p-amino benzylamine, m-amino benzylamine, 4,4'-bis(4-aminophenoxy)biphenyl, 4,4'-diaminodiphenyl ether, 3,3'-diaminodiphenyl ether, 3,4'-diaminodiphenyl ether, 4,4'-diaminodiphenyl sulfone, 3,3'-diaminodiphenyl sulfone, 3,3'-diaminodiphenyl methane, 4,4'-diaminodiphenyl methane, 4,4'-diaminodiphenyl sulfide, 3,3'-diamino benzophenone, 3,4'-diamino benzophenone, 4,4'-diamino benzophenone, 3,3'-dimethyl-4,4'-diaminodiphenyl methane, 1,3-bis(4-aminophenoxy)benzene, 1,3-bis(3-aminophenoxy)benzene, 1,4-bis(4-aminophenoxy)benzene, 1,4-bis(3-aminophenoxy)benzene, 2,2-bis[4-(4-aminophenoxy)phenyl]propane, 2,2-bis[4-(3-aminophenoxy)phenyl]propane, bis[4-(4-aminophenoxy)phenyl]methane, bis[4-(3-aminophenoxy)phenyl]methane, bis[4-(4-aminophenoxy)phenyl]ether, bis[4-(3-aminophenoxy)phenyl]ether, bis[4-(4-aminophenoxy)phenyl]sulfone, bis[4-(3-aminophenoxy)phenyl]sulfone, 2,2-bis[4-(4-aminophenoxy)phenyl]hexafluoropropane, 1,4-diamino cyclohexane, 4,4'-methylene bis(cyclohexyl amine), 3,3'-methylene bis(cyclohexyl amine), 4,4'-diamino-3,3'-dimethyl dicyclohexyl methane, 4,4'-diamino-3,3'-dimethyl dicyclohexyl, and benzidine. These aromatic diamines or alicyclic diamines may be used singly, or two or more of them may be used.

Among these aromatic diamines and alicyclic diamines, aromatic diamines having a structure with high bendability are preferred from the viewpoint of adhesiveness. Specifically, 1,3-bis(3-aminophenoxy)benzene, 3,3'-diaminodiphenyl sulfone, 4,4'-diaminodiphenyl ether, 3,3'-diaminodiphenyl ether, and 3,3'-diamino benzophenone are particularly preferred.

Among aromatic diamines and alicyclic diamines, the polyimide resin preferably contains an aromatic diamine having a hydroxyl group. If the polyimide resin contains an aromatic diamine having a hydroxyl group, fluidity in a high temperature range can be suppressed, and thus the protrusion of the resin composition in the bonding step by thermocompression bonding can be suppressed.

The aromatic diamine having a hydroxyl group is more preferably an aromatic diamine represented by the general formula (3):

[Chemical Formula 4]

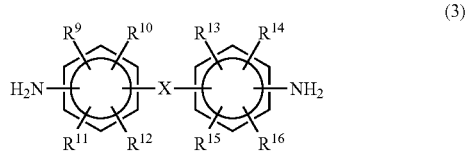

(3)

wherein at least one of $R^9$ to $R^{16}$ is a hydroxyl group, the others may be same or different, and each represent a group selected from a hydrogen atom, an alkyl group having 1 to 30 carbon atoms, an alkoxy group having 1 to 30 carbon atoms, a fluoroalkyl group having 1 to 30 carbon atoms, a halogen, a carboxyl group, a carboxylate ester group, a phenyl group, a sulfone group, a nitro group and a cyano group, as used herein, the halogen refers to fluorine, chlorine, bromine, or iodine, and X represents a direct bond or the following bonding structures.

[Chemical Formula 5]

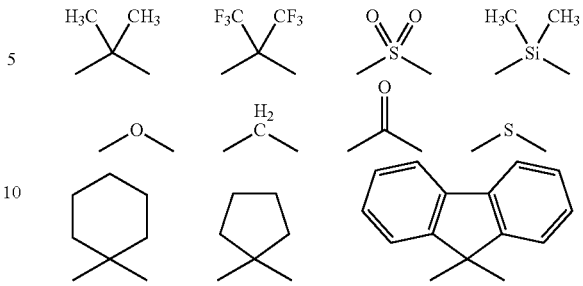

Specific examples of the aromatic diamine having a hydroxyl group represented by the general formula (3) include 4,4'-dihydroxy-3,3'-diaminophenylpropane, 4,4'-dihydroxy-3,3'-diaminophenylhexafluoropropane, 4,4'-dihydroxy-3,3'-diaminophenylsulfone, 4,4'-dihydroxy-3,3'-diaminophenyl ether, 3,3'-dihydroxy-4,4'-diaminophenyl ether, 4,4'-dihydroxy-3,3'-diaminophenylpropane methane, 4,4'-dihydroxy-3,3'-diaminobenzophenone, and 9,9-bis(3-amino-4-hydroxyphenyl) fluorene. These aromatic diamines having a hydroxyl group may be used singly, or two or more of them may be used.

The content of the aromatic diamine having a hydroxyl group is preferably 0.1 mol % or more and 40 mol % or less, more preferably 0.1 mol % or more and 30 mol % or less in the total diamine residues. Within this range, the protrusion of the resin composition in the bonding step by thermocompression bonding can be suppressed without impairing good adhesiveness.

The polyimide resin preferably contains a residue of an aromatic tetracarboxylic dianhydride as the acid dianhydride residue. If the polyimide resin contains the residue of the aromatic tetracarboxylic dianhydride, heat resistance is improved, and voids are not generated in the resin layer during the element processing step, and good heat resistance can be exhibited. The content of the residue of the aromatic tetracarboxylic dianhydride is preferably 90 mol % or more and 100 mol % or less in the total acid dianhydride residues.

Specific examples of the aromatic tetracarboxylic dianhydride include pyromellitic dianhydride, 3,3',4,4'-biphenyltetracarboxylic dianhydride, 2,2'-dimethyl-3,3',4,4'-biphenyltetracarboxylic dianhydride, 5,5'-dimethyl-3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-diphenyl ether tetracarboxylic dianhydride, 2,3,3',4'-diphenyl ether tetracarboxylic dianhydride, 2,2',3,3'-diphenyl ether tetracarboxylic dianhydride, 3,3',4,4'-benzophenone tetracarboxylic dianhydride, 2,2',3,3'-benzophenone tetracarboxylic dianhydride, 2,3,3',4'-benzophenone tetracarboxylic dianhydride, 3,3',4,4'-diphenylsulfone tetracarboxylic dianhydride, 2,3,3',4'-diphenylsulfone tetracarboxylic dianhydride, 3,3',4,4'-diphenylsulfoxide tetracarboxylic dianhydride, 3,3',4,4'-diphenylsulfide tetracarboxylic dianhydride, 3,3',4,4'-diphenylmethylene tetracarboxylic dianhydride, 4,4'-isopropylidenediphthalic dianhydride, 4,4'-(hexafluoroisopropylidene)diphthalic dianhydride, 3,4,9,10-perylenetetracarboxylic dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,3",4,4"-p-terphenyltetracarboxylic dianhydride, 3,3",4,4"-m-terphenyltetracarboxylic dianhydride, 2,3,6,7- anthracenetetracarboxylic dianhydride, and 1,2,7,8-phenanethrenetetracarboxylic dianhydride. These aromatic tetracarboxylic dianhydrides may be used singly, or two or more of them may be used.

The polyimide resin may contain a tetracarboxylic dianhydride having an aliphatic ring to such an extent that the heat resistance of the polyimide resin is not impaired. Specific examples of the tetracarboxylic dianhydride having an aliphatic ring include 2,3,5-tricarboxycyclopentyl acetic dianhydride, 1,2,3,4-cyclobutanetetracarboxylic dianhydride, 1,2,3,4-cyclopentanetetracarboxylic dianhydride, 1,2,3,5-cyclopentanetetracarboxylic dianhydride, 1,2,4,5-bicyclohexenetetracarboxylic dianhydride, 1,2,4,5-cyclohexanetetracarboxylic dianhydride, and 1,3,3a,4,5,9b-hexahydro-5-(tetrahydro-2,5-dioxo-3-furanyl)-naphtho[1,2-C]furane-1,3-dione. These tetracarboxylic dianhydrides may be used singly, or two or more of them may be used.

The molecular weight of the polyimide resin can be adjusted by using equimolar amounts of a tetracarboxylic acid component and a diamine component for the synthesis, or by using either of these components in excess. It is also possible to use either of the tetracarboxylic acid component and the diamine component in excess and block the terminal of the polymer chain with a terminal blocking agent such as an acid component or an amine component. As the terminal blocking agent of the acid component, a dicarboxylic acid or an anhydride thereof is preferably used. As the terminal blocking agent of the amine component, a monoamine is preferably used. In the adjustment, it is preferred to adjust the acid equivalent of the tetracarboxylic acid component and the amine equivalent of the diamine component to be equimolar including those of the terminal blocking agent of the acid component or the amine component.

When the molar ratio is adjusted so that the tetracarboxylic acid component is in excess or the diamine component is in excess, dicarboxylic acids such as benzoic acid, phthalic anhydride, tetrachlorophthalic anhydride, and aniline, or anhydrides thereof, or monoamines may be added as a terminal blocking agent.

The molar ratio of the tetracarboxylic acid component to the diamine component in the polyimide resin can be appropriately adjusted so that the viscosity of the resin composition falls within a range in which the resin composition is easy to use in coating or the like. The molar ratio of the tetracarboxylic acid component to the diamine component is generally adjusted in the range of 100/100 to 100/95 or 100/100 to 95/100. If the molar balance is disrupted, the molecular weight of the resin decreases, mechanical strength of the film formed from the resin decreases, and the adhesive force of the film tends to be low. Therefore, it is preferred to adjust the molar ratio in the range in which the adhesive force is not reduced.

The method of obtaining the polyimide resin by polymerization is not particularly limited. For example, when polyamic acid as a polyimide precursor is obtained by polymerization, a tetracarboxylic dianhydride and a diamine in an organic solvent are stirred at 0 to 100° C. for 1 to 100 hours to give a polyamic acid resin solution. When the polyimide resin is soluble in the organic solvent, after the polyamic acid is obtained by polymerization, the temperature is raised to 120 to 300° C., and the polyamic acid resin solution is stirred as it is for 1 to 100 hours to convert the polyamic acid into a polyimide. In this way, a polyimide resin solution is obtained. In this step, toluene, o-xylene, m-xylene, or p-xylene may be added to the reaction solution to remove water produced in the imidization reaction by azeotropy of the solvent and water.

The polyimide resin may be either of a polyimide or polyamic acid, a precursor of the polyimide. The polyimide resin may be a partially ring-closed and imidized polyimide precursor.

The resin composition of the present invention contains (b) a crosslinker including a fluorene group. The crosslinker is a compound that crosslinks the polyimide resin and is incorporated into the polyimide resin when it is heat cured, or a compound that forms a network structure by self reaction of the crosslinker and forms an interpenetrating polymer network structure with the polyimide resin when it is heat cured. Examples of the crosslinker include a compound having at least two crosslinkable functional groups selected from the group consisting of an epoxy group, an oxetane group, a maleimide group, an amino group, an isocyanate group, a methylol group, an acrylic group, a methacrylic group, and an episulfide group.

In the present invention, from the viewpoint of heat resistance, the crosslinker (b) including a fluorene group is more preferably a crosslinker including a structure represented by the general formula (4) or (5):

[Chemical Formula 6]

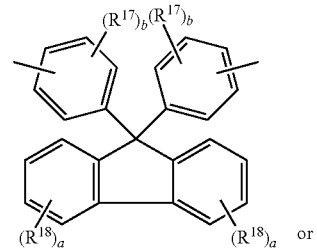

(4)

or

[Chemical Formula 7]

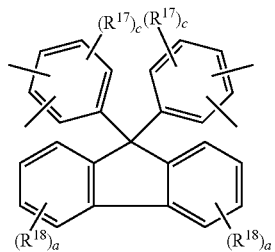

(5)

wherein $R^{17}$ and $R^{18}$ may be same or different, and each represent a group selected from an alkyl group having 1 to 30 carbon atoms, an alkoxy group having 1 to 30 carbon atoms, a fluoroalkyl group having 1 to 30 carbon atoms, a hydroxyl group, a halogen, a carboxyl group, a carboxylate ester group, a phenyl group, a sulfone group, a nitro group, and a cyano group, a and b each represent an integer of 0 to 4, c represents an integer of 0 to 3, and the halogen in $R^{17}$ and $R^{18}$ refers to fluorine, chlorine, bromine or iodine.

From the viewpoint of versatility, the crosslinker (b) including a fluorene group of the present invention is preferably a fluorene compound having an epoxy group, an acrylic group, or an episulfide group as a crosslinkable functional group, and is more preferably a fluorene compound having an epoxy group that is excellent in heat resistance and cost effectiveness.

Specific examples of the crosslinker including a fluorene group include "OGSOL" (registered trademark) PG 100, EG 200, CG 500, EG 280, and CG 400 (trade names, manufactured by Osaka Gas Chemicals Co., Ltd.) as an epoxy resin including a fluorene group, "OGSOL" (registered trademark) EA0200, EA0300, and GA5060P (trade names, manufactured by Osaka Gas Chemicals Co., Ltd.) as an acrylic resin including a fluorene group, and "OGSOL" (registered trademark) CS 500 (trade name, manufactured by Osaka Gas Chemicals Co., Ltd.) as an episulfide resin including a fluorene group. Among these, an epoxy resin including a fluorene group is preferred from the viewpoint of heat resistance and cost effectiveness.

If the resin composition of the present invention contains the crosslinker (b) including a fluorene group, the heat resistance of the resin composition is improved. In particular, the heat resistance during bonding of an electronic circuit formation substrate or semiconductor circuit formation substrate having a thickness of 1 μm or more and 100 μm or less is significantly improved.

The crosslinker (b) including a fluorene group preferably has a 5% weight loss temperature of 250° C. or more and 400° C. or less, more preferably has a 5% weight loss temperature of 300° C. or more and 400° C. or less. When the 5% weight loss temperature of the epoxy resin is 250° C. or more, the resin exhibits improved heat resistance, and when the 5% weight loss temperature of the epoxy resin is 400° C. or less, the resin exhibits good reactivity. Thus, poor appearance such as a blister does not occur in an electronic circuit formation substrate or semiconductor circuit formation substrate having a thickness of 1 μm or more and 100 μm or less in the heat treatment during bonding of the electronic circuit formation substrate or the semiconductor circuit formation substrate, and the epoxy resin can exhibit improved heat resistance.

The 5% weight loss temperature of the crosslinker (b) including a fluorene group can be measured using a thermogravimetric analyzer (TGA). The measuring method will be specifically described. A predetermined amount of a resin is put in the TGA, and held at 60° C. for 30 minutes to remove the moisture absorbed by the resin. Then, the resin is heated to 500° C. at a rate of 5° C./min. The temperature at which 5% of the weight has been lost in the obtained weight loss curve is taken as the 5% weight loss temperature.

The content of the crosslinker (b) including a fluorene group is preferably 0.1% by mass or more and 40% by mass or less relative to 100% by mass of the polyimide resin (a). The content of the crosslinker (b) including a fluorene group is more preferably 0.1% by mass or more and 20% by mass or less. When the content is less than 0.1% by mass, poor appearance such as a blister may occur depending on the thickness of the electronic circuit formation substrate or the semiconductor circuit formation substrate in the heat treatment during bonding of the electronic circuit formation substrate or semiconductor circuit formation substrate having a thickness of 1 μm or more and 100 μm or less. When the content is more than 40% by mass, crosslinking of films proceeds and solubility in a rework solvent is lowered, and thus residues may be generated after washing or a long time may be necessary for rework.

The resin composition of the present invention preferably contains (c) a siloxane polymer represented by the general formula (6):

[Chemical Formula 8]

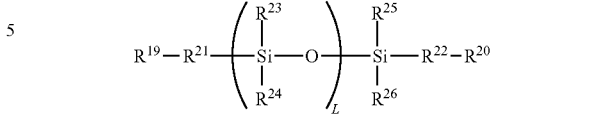

(6)

wherein L is an integer of 10 or more and 100 or less, $R^{19}$ and $R^{20}$ may be same or different and each represent a monovalent organic group having 1 to 30 carbon atoms and 0 to 3 nitrogen atoms, $R^{21}$ and $R^{22}$ may be same or different and each represent an alkylene group having 1 to 30 carbon atoms or a phenylene group, $R^{23}$ to $R^{26}$ may be same or different and each represent an alkyl group having 1 to 30 carbon atoms, an alkoxy group, a phenyl group, or a phenoxy group, and an alkoxy group having 1 to 30 carbon atoms of $R^{23}$ to $R^{26}$ does not include a polyoxyalkylene structure.

$R^{19}$ and $R^{20}$ may be same or different and each represent a monovalent organic group having 1 to 30 carbon atoms and 0 to 3 nitrogen atoms. For example, structures having an alkyl group, an alkylene group, an alkoxy group, a phenyl group, a phenoxy group, an amino group, a carboxyl group, a hydroxyl group, an epoxy group, an oxetane group, an ether group, an aralkyl group, an amide group, an imide group, a nitro group, or an ester group can be used.

From the viewpoint of heat resistance, $R^{19}$ and $R^{20}$ of the siloxane polymer represented by the general formula (6) are preferably amino groups. When $R^{19}$ and $R^{20}$ are amino groups, they react with the acid anhydride residue of the polyimide resin (a) during the heat treatment step and can improve heat resistance.

In the general formula (6), L is an integer of 10 or more and 100 or less. When the resin composition contains a siloxane polymer in which L is 10 or more and 100 or less, the adhesiveness of the surface of the resin layer obtained by applying the resin to a wafer and drying the resin can be lowered. Thus, the resin composition can bond the electronic circuit formation substrate or the semiconductor circuit formation substrate and the support substrate together, and then be peeled off by a mechanical force applied at room temperature under mild conditions. The resin composition can also be dissolved with the rework solvent described below or the like under mild conditions at room temperature to be peeled off.

An adhesive containing a resin composition not containing the siloxane polymer (c) represented by the general formula (6) has strong adhesiveness of the surface of the resin layer and is difficult to be peeled off by application of a mechanical force. Therefore, the adhesive can be suitably used as a permanent adhesive. Meanwhile, the adhesive can be dissolved with the rework solvent described below or the like under mild conditions at room temperature to be peeled off.

From the viewpoint of heat resistance, $R^{19}$ and $R^{20}$ in the general formula (6) preferably have a structure having an aromatic ring or an aromatic heterocyclic structure. Specific examples of $R^{19}$ and $R^{20}$ include, but are not limited to, the following structures.

[Chemical Formula 9]

-continued

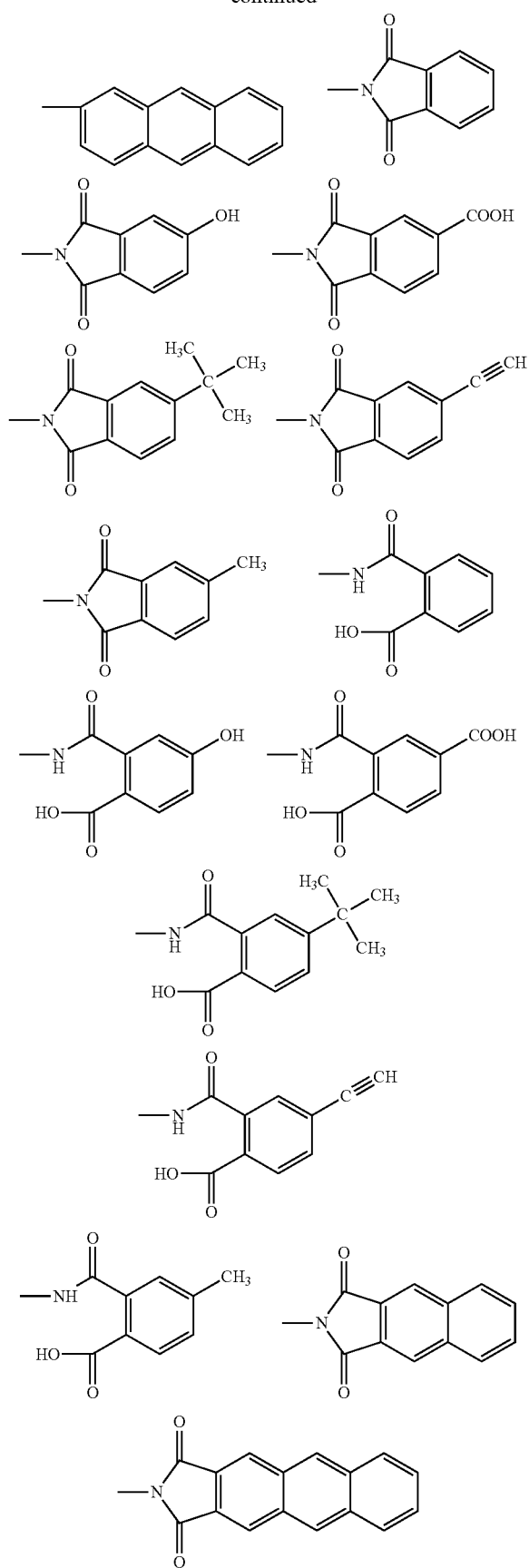

-continued

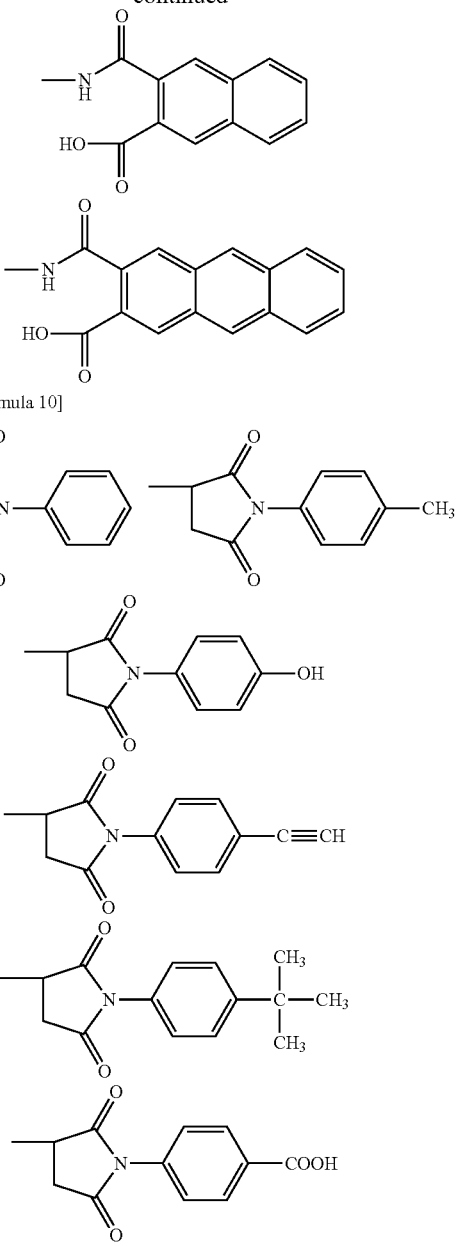

[Chemical Formula 10]

The content of the siloxane polymer (c) represented by the general formula (6) is preferably 0.01% by mass or more and 30% by mass or less relative to 100% by mass of the polyimide resin (a). The content of the siloxane polymer (c) represented by the general formula (6) is further preferably 0.1% by mass or more and 15% by mass or less. When the content is 0.01% by mass or more, the peeling property is improved, and when the content is 30% by mass or less, the adhesiveness between the resin layer and the support substrate can be maintained.

The siloxane polymer (c) represented by the general formula (6) may be added during or after the polymerization of the polyimide resin (a).

The resin composition of the present invention preferably contains (d) a silane coupling agent. If the resin composition contains the silane coupling agent (d) (d), the adhesiveness of the resin composition is improved and peeling of the wafer during polishing of the backside can be suppressed.

Examples of the silane coupling agent (d) include, but are not limited to, vinyltrimethoxysilane, vinyltriethoxysilane, epoxycyclohexylethyltrimethoxysilane, 3-glycidoxypropyltrimethoxysilane, 3-glycidoxypropyltriethoxysilane, p-styryltrimethoxysilane, 3-aminopropyltrimethoxysilane, 3-aminopropyltriethoxysilane, and N-phenyl-3-aminopropyltrimethoxysilane. The resin composition may contain two or more of them. In the present invention, from the viewpoint of heat resistance, a compound represented by the general formula (7) is preferred:

[Chemical Formula 11]

(7)

wherein $R^{27}$ represents a monovalent organic group having 2 to 20 carbon atoms and 1 to 3 nitrogen atoms, $R^{28}$ represents a hydrogen atom, an alkyl group having 1 to 20 carbon atoms, or an aromatic group, and d represents an integer of 0 to 4.

$R^{27}$ represents a monovalent organic group having 2 to 20 carbon atoms and 1 to 3 nitrogen atoms. For example, a structure having an amino group, an isocyanate group, or a ureido group can be used. Specific examples of the compound represented by the general formula (7) include, but are not limited to, the following structures.

[Chemical Formula 12]

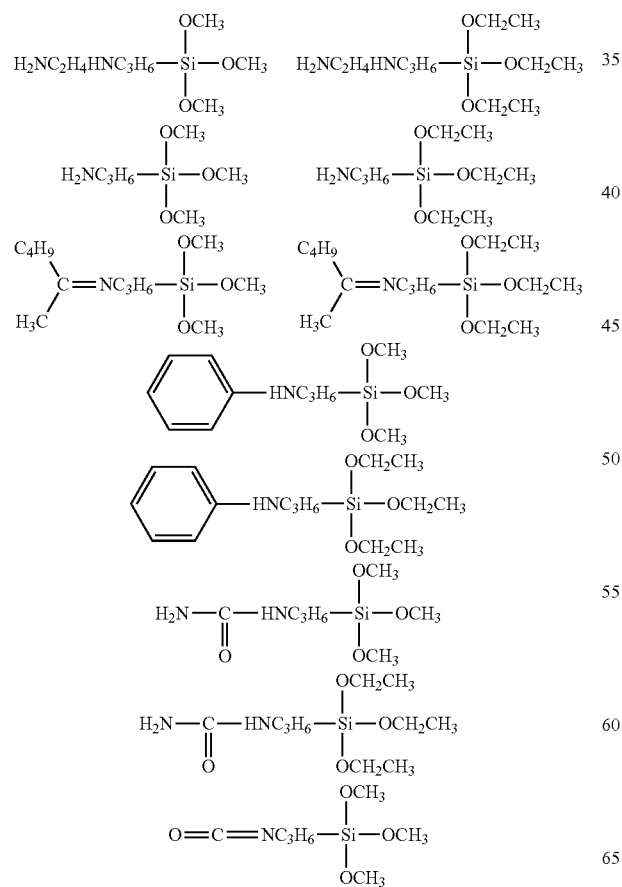

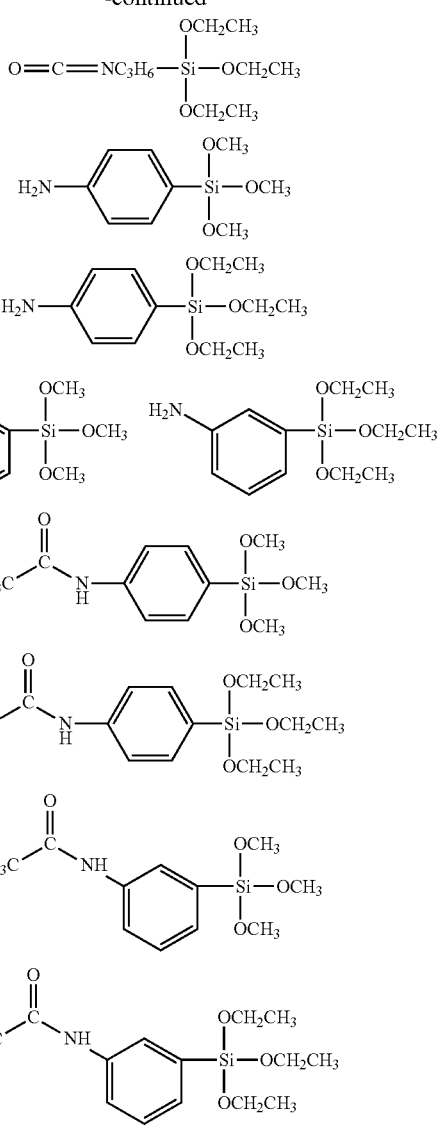

From the viewpoint of heat resistance, $R^{27}$ is preferably a structure having an aromatic ring or an aromatic heterocyclic structure. Preferred specific examples of the compound represented by the general formula (7) include, but are not limited to, the following structures.

[Chemical Formula 13]

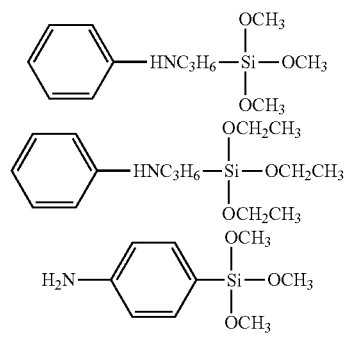

-continued

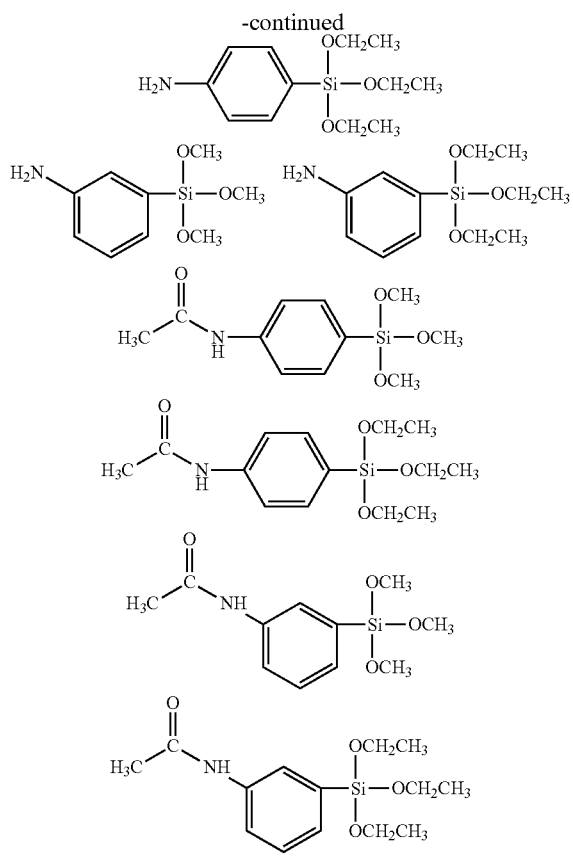

The content of the silane coupling agent (d) is preferably 0.01% by mass or more and 30% by mass or less relative to 100% by mass of the polyimide resin (a). The content of the silane coupling agent (d) is further preferably 0.1% by mass or more and 15% by mass or less. When the content is 0.01% by mass, an effect of improving the adhesiveness of the resin composition is exerted, and when the content is 30% by mass or less, the amount of the silane coupling agent remaining in the resin layer after the heat treatment can be minimized and generation of volatile components can be suppressed.

The silane coupling agent may be added during or after the polymerization of the polyimide resin (a).

The resin composition of the present invention preferably contains (e) inorganic fine particles. If the resin composition contains the inorganic fine particles, the heat resistance to the heat treatment after the bonding step of the resin composition can be improved. Specific examples of the inorganic fine particles include silica, alumina, titanium oxide, quartz powder, magnesium carbonate, potassium carbonate, barium sulfate, mica, and talc.

The inorganic fine particles (e) may be added during or after the polymerization of the polyimide resin (a).

The number average particle diameter of the inorganic fine particles (e) is preferably 2 nm or more and 5 μm or less, more preferably 5 nm or more and 3 μm or less. Within this range, the filterability of the resin composition is good, and the heat resistance to the heat treatment after the bonding step can be improved.

When a value as converted according to the specific surface area method is used, the number average particle diameter of the inorganic fine particles (e) of the present invention is obtained by drying followed by burning of the inorganic fine particles, measurement of the specific surface area of the resulting particles, and calculation of the particle size from the specific surface area to obtain the average particle diameter as a number average on the assumption that the particles are spheres. The instrument used is not particularly limited, and ASAP 2020 (trade name, manufactured by Micromeritics) or the like can be used.

The content of the inorganic fine particles (e) is preferably 0.1% by mass or more and 40% by mass or less relative to 100% by mass of the polyimide resin (a). The content of the inorganic fine particles (e) is further preferably 0.1% by mass or more and 20% by mass or less. Within this range, the filterability of the resin composition is good, and the heat resistance to the heat treatment after the bonding step can be improved.

The resin composition of the present invention may contain a solvent. If the resin composition contains a solvent, the viscosity of the resin composition can be adjusted to a viscosity suitable for coating methods described below. The content of the solvent is preferably 5% by mass or more and 100,000% by mass or less relative to 100% by mass of the polyimide resin (a).

Examples of the solvent to be used in the resin composition of the present invention include polar aprotic solvents such as N-methyl-2-pyrrolidone, γ-butyrolactone, N,N-dimethylformamide, N,N-dimethylacetamide, and dimethyl sulfoxide, ethers such as tetrahydrofuran, dioxane, and propylene glycol monomethyl ether, ketones such as acetone, methyl ethyl ketone, and diisobutyl ketone, esters such as ethyl acetate, propylene glycol monomethyl ether acetate, and ethyl lactate, and aromatic hydrocarbons such as toluene and xylene, and these solvents may be used singly, or two or more of them may be used.

The SP value of the solvent contained in the resin composition of the present invention is preferably 7.5 or more and 9.0 or less. The SP value is more preferably 7.5 or more and 8.0 or less. Because the polyimide resin (a) of the present invention contains a polysiloxane structure with low polarity and a residue with high polarity including a imide group and an aromatic group, layers of the resin composition may separate and thus the storage stability tends to be poor. However, if the resin composition contains a solvent having an SP value of 7.5 or more and 9.0 or less, layers do not separate and thus good storage stability can be exhibited.

Examples of the solvents having an SP value of 7.5 or more and 9.0 or less include methyl acetate (SP value: 8.8), ethyl acetate (SP value: 8.7), 3-methoxybutyl acetate (SP value: 8.7), diethylene glycol methyl ethyl ether (SP value: 8.2), diethylene glycol dimethyl ether (SP value: 8.1), dipropylene glycol methyl ether acetate (SP value: 8.7), methyl ethyl ketone (SP value: 9.0), dipropylene glycol dimethyl ether (SP value: 7.8), and dipropylene glycol methyl n-propyl ether (SP value: 8.0). These solvents may be used singly, or two or more of them may be used.

There are various methods for determining the SP value of a solvent. In the present invention, the SP value calculated from the estimation method proposed by Fedors is used. In the method of Fedors, the total cohesive energy and the total molar molecular capacity of the entire substance are calculated from the cohesive energy and the molar molecular volume of the structural unit of the substance, and the square root of the value obtained by dividing the total cohesive energy by the total molar molecular capacity is taken as SP value.

From the viewpoint of solubility of the polyimide resin (a), a solvent represented by the general formula (8) is preferred:

[Chemical Formula 14]

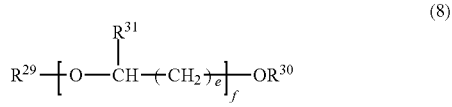

(8)

wherein $R^{29}$ and $R^{30}$ each independently represent a hydrogen atom, an alkyl group having 1 to 12 carbon atoms, an acetyl group, or an aromatic group, $R^{31}$ represents a hydrogen atom or a methyl group, e is 0, 1 or 2, and f is an integer of 1 to 3.

Specific examples of the solvent represented by the general formula (8) include, but are not limited to, propylene glycol mono-t-butyl ether, ethylene glycol mono-t-butyl ether, propylene glycol mono-n-butyl ether, propylene glycol monopropyl ether, propylene glycol monoethyl ether, ethylene glycol mono-n-butyl ether, ethylene glycol monopropyl ether, dipropylene glycol dimethyl ether, dipropylene glycol diethyl ether, dipropylene glycol dipropyl ether, dipropylene glycol di-n-butyl ether, dipropylene glycol di-t-butyl ether, dipropylene glycol monomethyl ether, dipropylene glycol monoethyl ether, dipropylene glycol monopropyl ether, dipropyl glycol mono-n-butyl ether, tripropylene glycol monomethyl ether, tripropylene glycol monoethyl ether, tripropylene glycol monopropyl ether, diethylene glycol methyl ethyl ether, and diethylene glycol dimethyl ether.

The solvent contained in the resin composition of the present invention more preferably has an SP value of 7.5 or more and 9.0 or less and is represented by the general formula (8). Examples of the solvent include dipropylene glycol dimethyl ether (SP value: 7.8), dipropylene glycol methyl-n-propyl ether (SP value: 8.0), diethylene glycol methyl ethyl ether (SP value: 8.2), and diethylene glycol dimethyl ether (SP value: 8.1). Dipropylene glycol dimethyl ether (SP value: 7.8) and dipropylene glycol methyl-n-propyl ether (SP value: 8.0) having an SP value of 7.5 or more and 8.0 or less are more preferred.

Other solvents can be added to such an extent that they do not impair the effect of the storage stability and solubility of the polyimide resin (a). Examples of the other solvents include, but are not limited to, amide polar solvents such as N-methyl-2-pyrrolidone, N,N-dimethylacetamide, N,N-dimethylformamide, and 1,3-dimethyl-2-imidazoline, lactone polar solvents such as β-propiolactone, γ-butyrolactone, γ-valerolactone, δ-valerolactone, γ-caprolactone, and ε-caprolactone, and ethyl lactate.

The organic solvent used as the polymerization solvent in the method in which the polyimide resin (a) is obtained by polymerization can be used as the solvent contained in the resin composition without being removed from the polymerization solution.

Other resins can be added to the resin composition of the present invention to such an extent that they do not impair the effect of the present invention. A surfactant may be added to improve characteristics such as tackiness, heat resistance, coating property, and storage stability. Other resins and a surfactant may be added during or after the polymerization of the polyimide resin (a).

The resin composition of the present invention preferably has a glass transition temperature after curing of 30° C. or more and 150° C. or less. The resin composition of the present invention further preferably has a glass transition temperature after curing of 40° C. or more and 120° C. or less. When the glass transition temperature after curing is 30° C. or more, the resin composition is not softened by the heat applied in the backside polishing step, and breakage of the wafer in the backside polishing step can be prevented. When the glass transition temperature after curing is 150° C. or less, the resin composition can exhibit good adhesiveness in thermocompression bonding.

The glass transition temperature of the resin composition of the present invention after curing can be measured using a differential scanning calorimeter (DSC). The measuring method will be specifically described. The resin composition of the present invention was applied in a thickness of 20 μm to a gloss surface of an 18 μm-thick electrolytic copper foil piece with a bar coater, and then dried at 80° C. for 10 minutes and at 150° C. for 10 minutes, and in addition, heated at 250° C. for 10 minutes in a nitrogen atmosphere to be completely cured, whereby a resin composition-laminated copper foil piece was obtained. Then, the whole surface of the copper foil of the obtained polyimide-laminated copper foil piece was etched with a ferric chloride solution to give a single film of the resin composition. About 10 mg of the obtained single film of the resin composition was placed in an aluminum standard container and measured with a differential scanning calorimeter DSC-50 (manufactured by Shimadzu Corporation). The glass transition temperature can be calculated from the inflection point of the obtained DSC curve.

The resin composition of the present invention can be suitably used in a resin layer including a coating film, a permanent adhesive, an adhesive for temporary bonding, and a laminated film.

The laminated film of the present invention can be obtained by laminating the resin composition of the present invention on one surface or both surfaces of a heat-resistant insulating film. The laminated film of the present invention can also be used as it is as an adhesive film. The laminated film can also be used as a transfer film. That is, the resin layer of the laminated film is pressure-bonded to a glass substrate or the like, and then only the heat-resistant insulating film is peeled off to transfer the resin layer to a glass substrate or the like.

Examples of the heat-resistant insulating film of the present invention include, but are not limited to, the following plastic films: a polypropylene film, a polyethylene film, a polystyrene film, a polyethylene terephthalate (PET) film, a polyphenylene sulfide (PPS) film, a polyimide film, a polyamide film, a polyamideimide film, a polyester film, an aromatic polyester film, a polyethersulfone film, fluorine-containing polymer films such as a polytetrafluoroethylene film (PTFE), a polyether ether ketone film, a polystyrene film, a polyphenylene ether film, a polyarylate film, and a polysulfone film. Specific examples of the plastic films include, but are not limited to, "Lumirror" (registered trademark), "Torelina" (registered trademark), and "Torayfan" (registered trademark) (manufactured by Toray Industries, Inc.), "Kapton" (registered trademark) (manufactured by DU PONT-TORAY CO., LTD.), "Upilex" (registered trademark) (manufactured by Ube Industries, Ltd.), and "Apical" (registered trademark) (manufactured by KANEKA CORPORATION) (all trade names).

The thickness of the heat-resistant insulating film is, without particular limitation, preferably 3 μm or more, more preferably 5 μm or more, still more preferably 10 μm or more from the viewpoint of strength as a support. The thickness of the heat-resistant insulating film is preferably 150 μm or less, more preferably 75 μm or less, still more preferably 50 μm or less from the viewpoint of flexibility.

Examples of the method of applying the resin composition of the present invention to the heat-resistant insulating film include a method in which a bar coater, a roll coater, a knife coater, a comma coater, a reverse coater, a doctor blade float coater, a gravure coater, a slit die coater or the like is used. A resin layer having good adhesiveness and heat resistance can be obtained by continuous or intermittent heat treatment of the resin composition at 50° C. or more and 500° C. or less, preferably at 70° C. or more and 450° C. or less for 1 minute or more and 3 hours or less after the application to remove the organic solvent in the resin composition and cure the resin composition.

When the laminated film of the present invention is used as a transfer film, from the viewpoint of transferability, the resin composition is applied to a heat-resistant insulating film, and then heat-treated continuously or intermittently at 50° C. or more and 200° C. or less, preferably at 70° C. or more and 150° C. or less for 1 minute or more and 3 hours or less to remove the organic solvent. A resin layer having good adhesiveness and heat resistance can be obtained by transfer to a substrate such as a glass substrate followed by additional continuous or intermittent heat treatment of the resin composition at 50° C. or more and 500° C. or less, preferably at 70° C. or more and 450° C. or less for 1 minute or more and 3 hours or less to cure the resin composition.

When the resin composition is laminated on both surfaces of the heat-resistant insulating film, the resin composition may be applied to one surface at a time and dried, or may be applied to both surfaces at once and dried. A release-treated film may be laminated on the surface of the applied resin composition as needed.

The thickness of the resin composition to be laminated can be appropriately selected, and is 0.1 µm or more and 500 µm or less, preferably 1 µm or more and 100 µm or less.

When the laminated film of the present invention is used as an adhesive film, one surface or both surfaces of the heat-resistant insulating film may be subjected to adhesiveness improvement treatment according to the purpose. As the adhesiveness improvement treatment, discharge treatment such as normal pressure plasma treatment, corona discharge treatment, or low temperature plasma treatment is preferred.

A press, a roll laminator or the like can be used to pressure-bond other substrates to the adhesive film, and the pressure bonding can be performed with heating as needed. In such a case, the temperature is 20° C. or more and 300° C. or less, preferably 250° C. or less. The pressure of the pressure bonding is 0.1 MPa or more and 2.0 MPa or less, more preferably 0.2 Mp or more and 1.5 MPa or less. The pressure bonding may be performed in air or in nitrogen. The pressure bonding is preferably performed in vacuum.

When the laminated film of the present invention is used as a transfer film, one surface or both surfaces of the heat-resistant insulating film may be subjected to release treatment according to the purpose. The release treatment is preferably application of a silicone resin, a fluororesin or the like.

When the resin composition is transferred, the resin layer of the laminated film is attached to a substrate such as a glass substrate and pressure-bonded to the substrate. A press, a roll laminator or the like can be used for the pressure bonding, and the pressure bonding can be performed with heating as needed. In such a case, the temperature is 20° C. or more and 200° C. or less, preferably 180° C. or less. The pressure of the pressure bonding is 0.05 MPa or more and 2.0 MPa or less, more preferably 0.1 Mp or more and 1.5 MPa or less.

The pressure bonding may be performed in air or in nitrogen. The pressure bonding is preferably performed in vacuum.

When other substrates are pressure-bonded to the transferred resin layer, the substrates are pressure-bonded with a press, a roll laminator or the like after peeling of the heat-resistant insulating film. The pressure bonding can be performed with heating as needed. In such a case, the temperature is 20° C. or more and 300° C. or less, preferably 250° C. or less. The pressure of the pressure bonding is 0.1 MPa or more and 2.0 MPa or less, more preferably 0.2 Mp or more and 1.5 MPa or less. The pressure bonding may be performed in air or in nitrogen. The pressure bonding is preferably performed in vacuum.

The resin composition of the present invention can be used in manufacture of an electronic component and a semiconductor device. More specifically, the resin composition can be suitably used in manufacture of an electronic component and a semiconductor device in which the electronic circuit formation substrate or semiconductor circuit formation substrate having a thickness of 1 µm or more and 100 µm or less is heat-treated in circuit formation processing. For example, the resin composition of the present invention is used in the manufacture of a thin capacitor and the manufacture of a semiconductor device in which semiconductor chips are laminated with the semiconductor chips connected with a through-silicon via (TSV) in order to achieve higher levels of integration and higher packaging density of semiconductor devices.

Because an electronic circuit formation substrate or semiconductor circuit formation substrate having a thickness of 1 µm or more and 100 µm or less warps largely, is difficult to form a circuit, and cracks and breaks easily, the electronic circuit formation substrate or the semiconductor circuit formation substrate is fixed to a support substrate such as a silicon substrate, a glass substrate, and a film, with an adhesive for temporary bonding, to form a processed wafer. The resin composition of the present invention can be suitably used as an adhesive for temporary bonding to bond the electronic circuit formation substrate or the semiconductor circuit formation substrate and the support substrate together. In particular, the resin composition has excellent heat resistance during bonding of the electronic circuit formation substrate or semiconductor circuit formation substrate having a thickness of 1 µm or more and 100 µm or less.

In the present invention, an electronic circuit formation substrate or semiconductor circuit formation substrate having a thickness of 1 µm or more and 100 µm or less can be bonded to a support substrate, or a thick electronic circuit formation substrate or semiconductor circuit formation substrate can be bonded to a support substrate and then thinned. As the thinning step, a polishing step, an etching step or the like can be employed.

For example, in the manufacture of an electronic component, a ceramic substrate, which is an electronic circuit formation substrate having a thickness of 1 µm or more and 100 µm or less, is bonded to a support substrate such as a silicon substrate, a glass substrate, and a film using an adhesive for temporary bonding to form a processed wafer. Then, the electronic circuit formation substrate is heat-treated at a temperature of 230° C. or more and 450° C. or less in circuit formation processing or the like. Then, the electronic circuit formation substrate is peeled from the support substrate. The resin composition of the present invention can be suitably used as the adhesive for temporary bonding for manufacturing electronic components.

For example, in the manufacture of a semiconductor device, a silicon substrate, which is a semiconductor circuit formation substrate, is bonded to a support substrate such as a silicon substrate, a glass substrate, and a film using an adhesive for temporary bonding to form a processed wafer. Then, the surface not having a circuit (the backside) is polished to form a semiconductor circuit formation substrate having a thickness of 1 μm or more and 100 μm or less. Then, the semiconductor circuit formation substrate is heat-treated at a temperature of 230° C. or more and 450° C. or less in circuit formation processing or the like. Then, the semiconductor circuit formation substrate is peeled from the support substrate. The resin composition of the present invention can be suitably used as the adhesive for temporary bonding for manufacturing semiconductor devices.

Examples of a method for applying the resin composition to a support substrate such as a silicon substrate, a glass substrate, and a film include a spin coater, a roll coater, screen printing, and a slit die coater. A resin layer may also be transferred and laminated on a support substrate using the above-mentioned transfer film. A resin layer having good adhesiveness and heat resistance can be obtained by continuous or intermittent heat treatment of the resin composition at 50° C. or more and 500° C. or less, preferably at 70° C. or more and 450° C. or less for 1 minute or more and 3 hours or less to remove the organic solvent in the resin composition and cure the resin composition after the application or transfer of the resin composition. The thickness of the resin layer can be appropriately selected, and is 0.1 μm or more and 500 μm or less, preferably 1 μm or more and 100 μm or less.

In the present invention, the resin composition may be applied and laminated on a support substrate, and in addition, the resin composition may be applied and laminated on an electronic circuit formation substrate or a semiconductor circuit formation substrate, or the resin layer of the resin composition may be transferred and laminated on an electronic circuit formation substrate or a semiconductor circuit formation substrate using the transfer film. A layer including other resin compositions can also be present on the side of the support substrate, or the electronic circuit formation substrate or the semiconductor circuit formation substrate. That is, the resin composition of the present invention can be used in combination with other adhesives. However, the electronic circuit formation substrate or the semiconductor circuit formation substrate and the support substrate are preferably bonded together only with the resin composition of the present invention, because the resin composition of the present invention is a resin composition that has excellent heat resistance during bonding of an electronic circuit formation substrate or a semiconductor circuit formation and has steady adhesive force through the process of manufacturing a semiconductor device or the like, and can be peeled off under mild conditions at room temperature after the manufacturing process. That is, in the processed wafer of the present invention, the electronic circuit formation substrate or the semiconductor circuit formation substrate and the support substrate are preferably bonded together only with the resin layer of the present invention or the laminated film of the present invention interposed between the electronic circuit formation substrate or the semiconductor circuit formation substrate and the support substrate. Due to bonding using one type of adhesive layer, only one adhesive layer is to be formed, and thus a burden on the process is reduced.

A processed wafer can be produced by stacking and pressure-bonding the support substrate on which the resin layer of the present invention is laminated and the electronic circuit formation substrate or the semiconductor circuit formation substrate together. For the pressure bonding, a press, a roll laminator or the like can be used. The pressure bonding can be performed with heating as needed. In such a case, the temperature is 20° C. or more and 300° C. or less, preferably 250° C. or less. The pressure of the pressure bonding is 0.1 MPa or more and 2.0 MPa or less, more preferably 0.2 Mp or more and 1.5 MPa or less. The pressure bonding may be performed in air or in nitrogen. The pressure bonding is preferably performed in vacuum.

In the present invention, a laminated film including a heat-resistant insulating film and the resin composition of the present invention on at least one surface of the heat-resistant insulating film, that is, the above-mentioned adhesive film can be used as the support substrate. A processed wafer can be produced by stacking and pressure-bonding the adhesive film on the electronic circuit formation substrate or the semiconductor circuit formation substrate. For pressure bonding, a press, a roll laminator or the like can be used. The pressure bonding can be performed with heating as needed. In such a case, the temperature is 20° C. or more and 300° C. or less, preferably 250° C. or less. The pressure of the pressure bonding is 0.1 MPa or more and 2.0 MPa or less, more preferably 0.2 Mp or more and 1.5 MPa or less. The pressure bonding may be performed in air or in nitrogen. The pressure bonding is preferably performed in vacuum.

Examples of a method for peeling the support substrate from the electronic circuit formation substrate or the semiconductor circuit formation substrate include a thermal slide peeling method, a laser irradiation peeling method, a mechanical peeling method at room temperature, and a solvent peeling method at room temperature. The resin composition of the present invention can be suitably used in the mechanical peeling method at room temperature or the solvent peeling method at room temperature. The mechanical peeling method at room temperature refers to a method of gradually mechanically peeling off the electronic circuit formation substrate or the semiconductor circuit formation substrate gradually from an end of the substrate at room temperature. The solvent peeling method at room temperature is a method in which a hole for solvent passage is formed in the support substrate, and the resin layer is dissolved with a solvent to peel off the support substrate. In the present invention, as the solvent used in the solvent peeling method, a rework solvent described below is preferably used.

The method may include, after the step of peeling the electronic circuit formation substrate or the semiconductor circuit formation substrate from the support substrate, a step of reworking the resin layer remaining on the electronic circuit formation substrate or the semiconductor circuit formation substrate and the support substrate as well as the residue of the resin layer with an organic solvent or an alkaline aqueous solution.

In the resin composition of the present invention, as the rework solvent, a rework solvent containing (A) an amine solvent and (B) a solvent represented by the general formula (8) is preferably used:

[Chemical Formula 15]

(8)

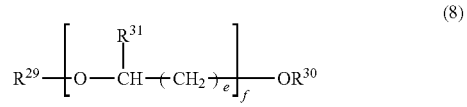

wherein $R^{29}$ and $R^{30}$ each independently represent a hydrogen atom, an alkyl group having 1 to 12 carbon atoms, an acetyl group, or an aromatic group, $R^{31}$ represents a hydrogen atom or a methyl group, e is 0, 1 or 2, and f is an integer of 1 to 3.

The amine solvent (A) has a ring opening effect on an imide group to make the resin composition easily soluble in the rework solvent, and thus, the washing time can be shortened. To open the ring of the imide group, an amine solvent including a primary amine and a secondary amine is preferred, and specific examples of the amine solvent include, but are not limited to, monomethanolamine, dimethanolamine, monoethanolamine, dimethanolamine, dimethylamine, monopropanolamine, isopropanolamine, isopropylamine, and diisopropylamine. An amine solvent including a primary amine is more preferred, and specific examples of the amine solvent include, but are not limited to, monomethanolamine, monoethanolamine, monopropanolamine, isopropanolamine, and isopropylamine.

From the viewpoint of solubility of the polyimide resin (a), the rework solvent preferably contains the solvent (B) represented by the general formula (8), and specific examples of the solvent (B) represented by the general formula (8) include, but are not limited to, propylene glycol mono-t-butyl ether, ethylene glycol mono-t-butyl ether, propylene glycol mono-n-butyl ether, propylene glycol monopropyl ether, propylene glycol monoethyl ether, ethylene glycol mono-n-butyl ether, ethylene glycol monopropyl ether, dipropylene glycol dimethyl ether, dipropylene glycol diethyl ether, dipropylene glycol dipropyl ether, dipropylene glycol di-n-butyl ether, dipropylene glycol di-t-butyl ether, dipropylene glycol monomethyl ether, dipropylene glycol monoethyl ether, dipropylene glycol monopropyl ether, dipropyl glycol mono-n-butyl ether, tripropylene glycol monomethyl ether, tripropylene glycol monoethyl ether, tripropylene glycol monopropyl ether, diethylene glycol methyl ethyl ether, and diethylene glycol dimethyl ether.

A solvent represented by the general formula (8) and having an SP value of 7.5 or more and 9.0 or less is more preferred. Examples of the solvent include dipropylene glycol dimethyl ether (SP value: 7.8), dipropylene glycol methyl-n-propyl ether (SP value: 8.0), diethylene glycol methyl ethyl ether (SP value: 8.2), and diethylene glycol dimethyl ether (SP value: 8.1). Dipropylene glycol dimethyl ether (SP value: 7.8) and dipropylene glycol methyl-n-propyl ether (SP value: 8.0) having an SP value of 7.5 or more and 8.0 or less are more preferred.

The rework solvent used in the present invention preferably contains an amide polar solvent in addition to (A) and (B). The amide polar solvent has the effect of compatibilizing (A) and (B) and improving the storage stability of the rework solvent. As the amide polar solvent, a polar solvent including a tertiary amide excellent in storage stability is preferred. Specific examples of the amide polar solvent include, but are not limited to, N-methyl-2-pyrrolidone, N,N-dimethylacetamide, N,N-dimethylformamide, and 1,3-dimethyl-2-imidazoline.

The rework solvent can contain an aqueous solution of sodium hydroxide, sodium hydrogencarbonate, potassium hydroxide, or tetramethylammonium hydroxide, or an organic solvent of dimethyl sulfoxide or the like as needed.

The rework solvent can be suitably used as a solvent used in a solvent peeling method at room temperature.

EXAMPLES

The present invention will be described below by way of examples. The present invention is not limited to these examples. Methods for measurement of glass transition temperature, measurement of 5% weight loss temperature, adhesiveness evaluation, protrusion evaluation, heat resistance evaluation after adhesiveness evaluation, back grinding evaluation, heat resistance evaluation after back grinding evaluation, peeling evaluation and rework evaluation will be described.

(1) Measurement of Glass Transition Temperature

Each resin composition of the following Manufacturing Examples 1 to 32 (AH1 to 32) was applied in a thickness of 20 μm to a gloss surface of an 18 μm-thick electrolytic copper foil piece with a bar coater, and then dried at 80° C. for 10 minutes and at 150° C. for 10 minutes, and then heat-treated at 250° C. for 10 minutes in a nitrogen atmosphere to be cured, whereby a resin composition-laminated copper foil piece was obtained. Then, the whole surface of the copper foil of the obtained resin composition-laminated copper foil piece was etched with a ferric chloride solution to give a single film of the resin composition.

About 10 mg of the obtained single film of the resin composition was placed in an aluminum standard container and measured with a differential scanning calorimeter DSC-50 (manufactured by Shimadzu Corporation) (DSC method). The glass transition temperature was calculated from the inflection point of the obtained DSC curve. The single film was predried at 80° C. for 1 hour, and then measured at a heating rate of 20° C./min.

(2) Measurement of 5% Weight Loss Temperature

About 15 mg of (b) a crosslinker including a fluorene group was placed in an aluminum standard container and measured using a thermogravimetric analyzer TGA-50 (manufactured by Shimadzu Corporation). The measurement conditions were as follows: the temperature was kept at 60° C. for 30 minutes and then was raised to 500° C. at a heating rate of 5° C./min.

The temperature at which 5% of the weight had been lost in the obtained weight loss curve was read and taken as the 5% weight loss temperature.

(3) Adhesiveness Evaluation

To an 8-inch silicon wafer (manufactured by Shin-Etsu Chemical Co., Ltd.) having a thickness of 750 μm, each resin composition obtained in the following Manufacturing Examples 1 to 32 was applied using a spin coater with adjusting the rotation speed so that the thickness after drying was 20 μm, heat-treated at 120° C. for 10 minutes to be dried, and then heat-treated at 200° C. for 3 minutes to be cured, whereby a resin composition layer-laminated silicon substrate was obtained.

Each laminated film S1 to S32 produced in the following Manufacturing Examples 33 to 64 was laminated on an 8-inch silicon substrate (manufactured by Shin-Etsu Chemical Co., Ltd.) using a vacuum laminator VTM-200M (manufactured by Takatori Corporation) so that the resin layer of each laminated film would come into contact with the silicon substrate. The lamination conditions were as follows: a heater temperature of 100° C., a roll temperature of 100° C., a lamination speed of 5 mm/sec, a lamination roll pressure of 0.2 MPa, and a chamber pressure of 150 Pa. The support film layer of the obtained laminate was peeled off to give a resin composition-laminated substrate.

An 8-inch alkali-free glass substrate (manufactured by Corning Incorporated) having a thickness of 0.7 mm was placed over the resin composition-laminated silicon substrate produced by the above method, and the substrates were pressure-bonded at a pressure of 0.5 MPa for 5 minutes using a hot press with the upper plate and the lower plate each set at 180° C. to give a glass substrate-laminated silicon substrate.

Each laminated film produced in the following Manufacturing Examples 65 to 96 was laminated on an 8-inch silicon substrate (manufactured by Shin-Etsu Chemical Co., Ltd.) using a vacuum laminator VTM-200M (manufactured by Takatori Corporation) so that the resin layer of each laminated film would come into contact with the silicon substrate. The lamination conditions were as follows: a heater temperature of 100° C., a roll temperature of 100° C., a lamination speed of 5 mm/sec, a lamination roll pressure of 0.2 MPa, and a chamber pressure of 150 Pa. The obtained laminated substrate was pressure-bonded for 5 minutes at 0.5 MPa using a hot press with the upper plate and the lower plate each set at 180° C. to give a film-laminated silicon substrate.

If the glass substrate or the film was successfully laminated on the silicon substrate, the adhesiveness was evaluated as "A", and if the glass substrate or the film was not successfully laminated on the silicon substrate, the adhesiveness was evaluated as "D".

The obtained glass substrate-laminated silicon substrate or film-laminated silicon substrate was observed with the naked eye from the glass side or film side to evaluate the presence or absence of voids. The evaluation criteria are as follows.
A: No void
B: Voids of 1 cm or less
C: Voids of 1 cm or more (4) Protrusion Evaluation The glass substrate-laminated silicon substrate or the film-laminated silicon substrate evaluated as described above for adhesiveness was visually observed from the edge of the silicon substrate for protrusions of the resin composition. The evaluation criteria are as follows.
A: No protrusion
B: Protrusion (5) Heat Resistance Evaluation after Adhesiveness Evaluation The glass substrate-laminated silicon substrate or the film-laminated silicon substrate evaluated as described above for protrusions was heat-treated at 250° C. for 10 minutes and then observed with the naked eye from the glass or film side to evaluate the presence or absence of voids. The evaluation criteria are as follows.
A: No void
B: Voids of 1 cm or less
C: Voids of 1 cm or more (6) Back Grinding Evaluation of Silicon Substrate The glass substrate-laminated silicon substrate or the film-laminated silicon substrate evaluated as described above for heat resistance after the adhesiveness evaluation was set in a grinder DAG810 (manufactured by DISCO Corporation), and the silicon substrate was polished to a thickness of 30 μm or 100 μm. The silicon substrate after grinding was observed with the naked eye, and the presence or absence of fractures or cracks was evaluated. The evaluation criteria are as follows.
A: No fracture or crack in both 30 μm and 100 μm substrates
B: Fracture and/or crack in only 30 μm substrate
C: Fracture and/or crack in only 100 μm substrate
D: Fracture and/or crack in both 30 μm and 100 μm substrates (7) Heat Resistance Evaluation after Back Grinding Evaluation The glass substrate-laminated silicon substrate or the film-laminated silicon substrate evaluated as described above for back grinding was heat-treated at 270° C. for 10 minutes and then observed with the naked eye from the thin silicon substrate side to evaluate the presence or absence of a blister in the thin silicon substrate. The evaluation criteria are as follows.
A: No blister in both 30 μm and 100 μm substrates
B: Blister only in 30 μm substrate
C: Blister only in 100 μm substrate
D: Blister in both 30 μm and 100 μm substrates (8) Evaluation of Peeling 1. Mechanical Peeling Method at Room Temperature A dicing tape was attached to the silicon substrate of the glass substrate-laminated silicon substrate or the film-laminated silicon substrate back ground as described above using a dicing frame, the dicing tape surface was set on a suction pad by vacuum suction, and then one point of the glass substrate or the film was lifted with a pincette at room temperature to peel off the glass substrate.

2. Solvent Peeling Method at Room Temperature

A glass substrate-laminated silicon substrate was produced using the above 8-inch alkali-free glass substrate provided with holes for solvent passage. Then, the substrate was immersed in the rework solvent obtained in Manufacturing Example 97 under the condition of 23° C. for 10 minutes, and then the substrate was peeled off with bare hands. The film-laminated silicon substrate was not subjected to solvent peeling at room temperature.

The evaluation criteria for peeling evaluation are as follows.
Glass Substrate-Laminated Silicon Substrate
A: Successfully peeled off in both 1. and 2.
B1: Successfully peeled off only in 1. Mechanical peeling method at room temperature.
B2: Successfully peeled off only in 2. Solvent peeling method at room temperature.
C: Not successfully peeled off in both 1. and 2. Film laminated-silicon substrate
a: Successfully peeled off in Mechanical peeling method at room temperature.
c: Not successfully peeled off.

(9) Rework Evaluation

The resin layer attached to the silicon substrate peeled off as described above was reworked under the conditions of 23° C. for 10 minutes with the rework solvent obtained in Manufacturing Example 97, and the solubility was observed with the naked eye. The evaluation criteria are as follows.
A: No residue
B: Dissolved, but a residue remained on the substrate.
C: Not dissolved.

(10) Measurement of Average Molecular Weight of Polysiloxane Diamine and Calculation of Numerical Value of n Polysiloxane diamine (5 g) as a sample was taken in a beaker, and 50 mL of a 1:1 mixed solution of IPA and toluene was added to the beaker to dissolve the polysiloxane diamine. Then, using an automatic potentiometric titrator AT-610 manufactured by Kyoto Electronics Manufacturing Co., Ltd., a 0.1 N aqueous hydrochloric acid solution was added dropwise with stirring to the resulting solution, and the amount of the aqueous solution added until the neutralization point was determined. The average molecular weight was calculated from the amount of the added 0.1 N aqueous hydrochloric acid solution according to the following formula (9).

$$2\times[10\times36.5\times(\text{amount of added aqueous solution (g)})]/5 = \text{average molecular weight} \quad (9)$$

Then, the molecular weights of the polysiloxane diamine used were calculated from its chemical structural formula for the cases of n=1 and n=10, and a relationship between the value of n and the molecular weight was obtained as a relational expression of a linear function. The average value of n was determined by applying the average molecular weights to the relational expression.

Names of abbreviations of acid dianhydrides, diamines, fillers, and solvents shown in the following manufacturing examples are as follows.

ODPA: 3,3',4,4'-diphenyl ether tetracarboxylic dianhydride

APPS1: α,ω-bis(3-aminopropyl)polydimethylsiloxane (average molecular weight: 860, n=9 in formula (1))

APPS2: α,ω-bis(3-aminopropyl)polydimethylsiloxane (average molecular weight: 1600, n=19 in formula (1))

APPS3: α,ω-bis(3-aminopropyl)polydimethylsiloxane (average molecular weight: 4400, n=57 in formula (1))

APB: 1,3-bis(3-aminophenoxy)benzene

FDA: 9,9-bis(3-amino-4-hydroxyphenyl)fluorene

BAFL: 9,9-bis(4-aminophenyl)fluorene

PG-100: fluorene group-containing epoxy resin (manufactured by Osaka Gas Chemicals Co., Ltd.)

CG-500: fluorene group-containing epoxy resin (manufactured by Osaka Gas Chemicals Co., Ltd.)

EG-200: fluorene group-containing epoxy resin (manufactured by Osaka Gas Chemicals Co., Ltd.)

EG-280: fluorene group-containing epoxy resin (manufactured by Osaka Gas Chemicals Co., Ltd.)

CG-400: fluorene group-containing epoxy resin (manufactured by Osaka Gas Chemicals Co., Ltd.)

CS-500: fluorene group-containing episulfide resin (manufactured by Osaka Gas Chemicals Co., Ltd.)

EA-0300: fluorene group-containing acrylic resin (manufactured by Osaka Gas Chemicals Co., Ltd.)

JER828: 2,2-bis(4-glycidyloxyphenyl)propane (manufactured by Mitsubishi Chemical Corporation)

MEK-ST-40: Organic solvent-dispersed silica (solvent: MEK, silica: 40 wt %) (manufactured by Nissan Chemical Industries, Ltd.)

DMM: dipropylene glycol dimethyl ether

Synthesis Example 1 (Polymerization of Polyamic Acid)

Into a reaction kettle equipped with a thermometer, a dry nitrogen inlet, a heating/cooling unit that operates with warm water/cooling water, and a stirrer, 602.0 g (0.7 mol) of APPS1, 43.8 g (0.15 mol) of APB, and 57.1 g (0.15 mol) of FDA were charged together with 1013.1 g of DMM, and dissolved. Then, to the resulting solution, 310.2 g (1 mol) of ODPA was added, and the resulting mixture was reacted at room temperature for 1 hour and then at 60° C. for 5 hours to give a 50% by mass polyamic acid solution PA1.

Synthesis Examples 2 to 6 (Polymerization of Polyamic Acid)

A 50% by mass polyamic acid solution (PA2 to PA5) was obtained in the same manner as in Manufacturing Example 1 except that the type and the charged amount of acid dianhydride and diamine were changed as shown in Table 1.

TABLE 1

Upper row: ratio (mol %)/lower row: content (g) Resin concentration: 50 wt %

| | | Acid dianhydride | Diamine | | | | | Solvent (g) |
| --- | --- | --- | --- | --- | --- | --- | --- | --- |
| | | | Siloxane | | Aromatic | | | DMM |
| | | ODPA | APPS1 | APPS2 | APB | FDA | BAFL | (SP value: 7.8) |
| Synthesis Example 1 | PA1 | 100 310.2 | 70 602.0 | | 15 43.8 | 15 57.1 | | 1013.1 |
| Synthesis Example 2 | PA2 | 100 310.2 | 80 688.0 | | 10 29.2 | 10 38.0 | | 1065.4 |
| Synthesis Example 3 | PA3 | 100 310.2 | | 80 1280.0 | 10 29.2 | 10 38.0 | | 1657.4 |
| Synthesis Example 4 | PA4 | 100 310.2 | 60 516.0 | | 25 73.0 | 15 57.1 | | 956.3 |
| Synthesis Example 5 | PA5 | 100 310.2 | 50 430.0 | | 35 102.3 | 15 57.1 | | 899.6 |
| Synthesis Example 6 | PA6 | 100 310.2 | 70 602.0 | | 15 43.8 | | 15 52.3 | 1008.3 |

Synthesis Example 7

Into a 500-ml flask, 500 g of hexane was charged, and 21.33 g (0.1 mol) of aminophenyltrimethoxysilane (a mixture of 3-aminophenyltrimethoxysilane and 4-aminophenyltrimethoxysilane at a weight ratio of 6:4) was added to the flask. Then, 10.21 g (0.1 mol) of acetic anhydride was added dropwise slowly, and the resulting mixture was reacted at room temperature for 3 hours. The precipitate was filtered off and dried, and the resulting compound was designated as AcAPMS. The structure of AcAPMS is shown below.

[Chemical Formula 16]

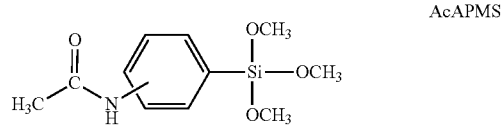

AcAPMS

Manufacturing Example 1 (Adjustment of Resin Composition)

To a reaction kettle equipped with a stirrer, 200.0 g of the polyamic acid solution (PA1) obtained in Synthesis Example 1, 10.0 g of CG500, an epoxy resin, and 12.0 g of MEK-ST-40, a filler solution were charged together and stirred for 2 hours at room temperature to give a resin composition (AH1).

Manufacturing Examples 2 to 32 (Adjustment of Resin Composition)

Resin compositions (AH2 to AH32) were obtained in the same manner as in Manufacturing Example 1 except that the type and the charged amount of the polyimide resin (a), the epoxy resin (b), the siloxane polymer (c), the silane coupling agent (d), and the filler (e) were changed as shown in Table 2.

TABLE 2

| | | (a) Polyimide resin Concentration: 50 wt % | | (b) Crosslinker including fluorene group | | | (c) Siloxane polymer | |
|---|---|---|---|---|---|---|---|---|
| | | Type | Charged amount (g) | Type | 5% Weight loss temperature (° C.) | Charged amount (g) | Type | Charged amount (g) |
| Manufacturing Example 1 | AH1 | PA1 | 200.0 | CG500 | 400 | 0.1 | | |
| Manufacturing Example 2 | AH2 | PA1 | 200.0 | CG500 | 400 | 1.0 | | |
| Manufacturing Example 3 | AH3 | PA1 | 200.0 | CG500 | 400 | 10.0 | | |
| Manufacturing Example 4 | AH4 | PA1 | 200.0 | CG500 | 400 | 20.0 | | |
| Manufacturing Example 5 | AH5 | PA1 | 200.0 | CG500 | 400 | 40.0 | | |
| Manufacturing Example 6 | AH6 | PA2 | 200.0 | CG500 | 400 | 10.0 | | |
| Manufacturing Example 7 | AH7 | PA3 | 200.0 | CG500 | 400 | 10.0 | | |
| Manufacturing Example 8 | AH8 | PA3 | 200.0 | CG500 | 400 | 10.0 | | |
| Manufacturing Example 9 | AH9 | PA3 | 200.0 | CG500 | 400 | 10.0 | | |
| Manufacturing Example 10 | AH10 | PA3 | 200.0 | CG500 | 400 | 10.0 | | |
| Manufacturing Example 11 | AH11 | PA4 | 200.0 | CG500 | 400 | 10.0 | | |
| Manufacturing Example 12 | AH12 | PA5 | 200.0 | CG500 | 400 | 10.0 | | |
| Manufacturing Example 13 | AH13 | PA6 | 200.0 | CG500 | 400 | 10.0 | | |
| Manufacturing Example 14 | AH14 | PA1 | 200.0 | EG200 | 386 | 10.0 | | |
| Manufacturing Example 15 | AH15 | PA1 | 200.0 | EG280 | 368 | 10.0 | | |
| Manufacturing Example 16 | AH16 | PA1 | 200.0 | PG100 | 354 | 10.0 | | |
| Manufacturing Example 17 | AH17 | PA1 | 200.0 | CG400 | 326 | 10.0 | | |
| Manufacturing Example 18 | AH18 | PA1 | 200.0 | CS500 | 282 | 10.0 | | |
| Manufacturing Example 19 | AH19 | PA1 | 200.0 | EA0300 | 395 | 10.0 | | |
| Manufacturing Example 20 | AH20 | PA1 | 200.0 | JER828 | 280 | 10.0 | | |
| Manufacturing Example 21 | AH21 | PA3 | 200.0 | CG500 | 400 | 10.0 | | |
| Manufacturing Example 22 | AH22 | PA1 | 200.0 | CG500 | 400 | 10.0 | APPS3 | 0.001 |
| Manufacturing Example 23 | AH23 | PA1 | 200.0 | CG500 | 400 | 10.0 | APPS3 | 0.01 |
| Manufacturing Example 24 | AH24 | PA1 | 200.0 | CG500 | 400 | 10.0 | APPS3 | 1.0 |
| Manufacturing Example 25 | AH25 | PA1 | 200.0 | CG500 | 400 | 10.0 | APPS3 | 15.0 |
| Manufacturing Example 26 | AH26 | PA1 | 200.0 | CG500 | 400 | 10.0 | APPS3 | 30.0 |
| Manufacturing Example 27 | AH27 | PA3 | 200.0 | CG500 | 400 | 10.0 | APPS3 | 1.0 |
| Manufacturing Example 28 | AH28 | PA3 | 200.0 | CG500 | 400 | 10.0 | APPS3 | 1.0 |
| Manufacturing Example 29 | AH29 | PA3 | 200.0 | CG500 | 400 | 10.0 | APPS3 | 1.0 |

TABLE 2-continued

| | | | | | | | | |
|---|---|---|---|---|---|---|---|---|
| Manufacturing Example 30 | AH30 | PA3 | 200.0 | CG500 | 400 | 10.0 | APPS3 | 1.0 |
| Manufacturing Example 31 | AH31 | PA1 | 200.0 | | | | | |
| Manufacturing Example 32 | AH32 | PA3 | 200.0 | | | | | |

| | | (d) Silane coupling agent | | (e) Inorganic particles Concentration: 40 wt % | | Glass transition temperature (° C.) |
|---|---|---|---|---|---|---|
| | | Type | Charged amount (g) | Type | Charged amount (g) | |
| Manufacturing Example 1 | AH1 | | | MEK-ST-40 | 20.0 | 60 |
| Manufacturing Example 2 | AH2 | | | MEK-ST-40 | 20.0 | 75 |
| Manufacturing Example 3 | AH3 | | | MEK-ST-40 | 20.0 | 81 |
| Manufacturing Example 4 | AH4 | | | MEK-ST-40 | 20.0 | 85 |
| Manufacturing Example 5 | AH5 | | | MEK-ST-40 | 20.0 | 87 |
| Manufacturing Example 6 | AH6 | | | MEK-ST-40 | 20.0 | 54 |
| Manufacturing Example 7 | AH7 | | | | | 33 |
| Manufacturing Example 8 | AH8 | | | MEK-ST-40 | 1.0 | 34 |
| Manufacturing Example 9 | AH9 | | | MEK-ST-40 | 10.0 | 34 |
| Manufacturing Example 10 | AH10 | | | MEK-ST-40 | 20.0 | 36 |
| Manufacturing Example 11 | AH11 | | | MEK-ST-40 | 20.0 | 109 |
| Manufacturing Example 12 | AH12 | | | MEK-ST-40 | 20.0 | 122 |
| Manufacturing Example 13 | AH13 | | | MEK-ST-40 | 20.0 | 85 |
| Manufacturing Example 14 | AH14 | | | MEK-ST-40 | 20.0 | 78 |
| Manufacturing Example 15 | AH15 | | | MEK-ST-40 | 20.0 | 76 |
| Manufacturing Example 16 | AH16 | | | MEK-ST-40 | 20.0 | 75 |
| Manufacturing Example 17 | AH17 | | | MEK-ST-40 | 20.0 | 73 |
| Manufacturing Example 18 | AH18 | | | MEK-ST-40 | 20.0 | 73 |
| Manufacturing Example 19 | AH19 | | | MEK-ST-40 | 20.0 | 70 |
| Manufacturing Example 20 | AH20 | | | MEK-ST-40 | 20.0 | 69 |
| Manufacturing Example 21 | AH21 | AcAPMS | 1.0 | MEK-ST-40 | 20.0 | 34 |
| Manufacturing Example 22 | AH22 | | | MEK-ST-40 | 20.0 | 78 |
| Manufacturing Example 23 | AH23 | | | MEK-ST-40 | 20.0 | 79 |
| Manufacturing Example 24 | AH24 | | | MEK-ST-40 | 20.0 | 79 |
| Manufacturing Example 25 | AH25 | | | MEK-ST-40 | 20.0 | 80 |
| Manufacturing Example 26 | AH26 | | | MEK-ST-40 | 20.0 | 81 |
| Manufacturing Example 27 | AH27 | AcAPMS | 0.001 | MEK-ST-40 | 20.0 | 33 |
| Manufacturing Example 28 | AH28 | AcAPMS | 0.01 | MEK-ST-40 | 20.0 | 33 |
| Manufacturing Example 29 | AH29 | AcAPMS | 1.0 | MEK-ST-40 | 20.0 | 33 |
| Manufacturing Example 30 | AH30 | AcAPMS | 15.0 | MEK-ST-40 | 20.0 | 31 |
| Manufacturing Example 31 | AH31 | | | MEK-ST-40 | 20.0 | 55 |
| Manufacturing Example 32 | AH32 | | | MEK-ST-40 | 20.0 | 21 |

Manufacturing Example 33

The resin composition (AH1) obtained in Manufacturing Example 1 was applied to a support film layer SR7 (thickness: 75 μm, a polyester film, manufactured by OHTSUKI INDUSTRIAL CO., LTD.) with a bar coater, and dried at 100° C. for 10 minutes. Then, SR7 (manufactured by OHTSUKI INDUSTRIAL CO., LTD.) was laminated thereon as a protective film layer to give a laminated film (S1) having a resin layer thickness of 20 μm.

Manufacturing Examples 34 to 64

Laminated films (S2 to S32) were obtained in the same manner as in Manufacturing Example 33 except that the type of the resin composition was changed as shown in Table 3.

TABLE 3

| | Laminated film | Resin composition | Support film | Protective film |
|---|---|---|---|---|
| Manufacturing Example 33 | S1 | AH1 | SR7 | SR7 |
| Manufacturing Example 34 | S2 | AH2 | Polyester film | Polyester film |
| Manufacturing Example 35 | S3 | AH3 | | |
| Manufacturing Example 36 | S4 | AH4 | | |
| Manufacturing Example 37 | S5 | AH5 | | |
| Manufacturing Example 38 | S6 | AH6 | | |
| Manufacturing Example 39 | S7 | AH7 | | |
| Manufacturing Example 40 | S8 | AH8 | | |
| Manufacturing Example 41 | S9 | AH9 | | |
| Manufacturing Example 42 | S10 | AH10 | | |
| Manufacturing Example 43 | S11 | AH11 | | |
| Manufacturing Example 44 | S12 | AH12 | | |
| Manufacturing Example 45 | S13 | AH13 | | |
| Manufacturing Example 46 | S14 | AH14 | | |
| Manufacturing Example 47 | S15 | AH15 | | |
| Manufacturing Example 48 | S16 | AH16 | | |
| Manufacturing Example 49 | S17 | AH17 | | |
| Manufacturing Example 50 | S18 | AH18 | | |
| Manufacturing Example 51 | S19 | AH19 | | |
| Manufacturing Example 52 | S20 | AH20 | | |
| Manufacturing Example 53 | S21 | AH21 | | |
| Manufacturing Example 54 | S22 | AH22 | | |
| Manufacturing Example 55 | S23 | AH23 | | |
| Manufacturing Example 56 | S24 | AH24 | | |
| Manufacturing Example 57 | S25 | AH25 | | |
| Manufacturing Example 58 | S26 | AH26 | | |
| Manufacturing Example 59 | S27 | AH27 | | |
| Manufacturing Example 60 | S28 | AH28 | | |
| Manufacturing Example 61 | S29 | AH29 | | |
| Manufacturing Example 62 | S30 | AH30 | | |
| Manufacturing Example 63 | S31 | AH31 | | |
| Manufacturing Example 64 | S32 | AH32 | | |

Manufacturing Example 65

The resin composition (AH1) obtained in Manufacturing Example 1 was applied to a support film layer 140EN-Y (thickness: 35 μm, 1% weight loss temperature: higher than 450° C., melting point: higher than 300° C., linear expansion coefficient: 5 ppm/° C., a polyimide film, manufactured by DU PONT-TORAY CO., LTD.) with a bar coater, and dried at 100° C. for 10 minutes, and then heat-treated at 200° C. for 3 minutes to be cured. SR7 (manufactured by OHTSUKI INDUSTRIAL CO., LTD.) was laminated thereon as a protective film layer to give a laminated film (S33) having a resin layer thickness of 20 μm.

Manufacturing Examples 66 to 96

Laminated films (S34 to S64) were obtained in the same manner as in Manufacturing Example 65 except that the type of the resin composition was changed as shown in Table 4.

TABLE 4

| | Laminated film | Resin composition | Support film | Protective film |
|---|---|---|---|---|
| Manufacturing Example 65 | S33 | AH1 | 140EN-Y Polyimide film | SR7 Polyester film |
| Manufacturing Example 66 | S34 | AH2 | | |
| Manufacturing Example 67 | S35 | AH3 | | |
| Manufacturing Example 68 | S36 | AH4 | | |
| Manufacturing Example 69 | S37 | AH5 | | |
| Manufacturing Example 70 | S38 | AH6 | | |
| Manufacturing Example 71 | S39 | AH7 | | |
| Manufacturing Example 72 | S40 | AH8 | | |
| Manufacturing Example 73 | S41 | AH9 | | |
| Manufacturing Example 74 | S42 | AH10 | | |
| Manufacturing Example 75 | S43 | AH11 | | |
| Manufacturing Example 76 | S44 | AH12 | | |
| Manufacturing Example 77 | S45 | AH13 | | |
| Manufacturing Example 78 | S46 | AH14 | | |
| Manufacturing Example 79 | S47 | AH15 | | |
| Manufacturing Example 80 | S48 | AH16 | | |
| Manufacturing Example 81 | S49 | AH17 | | |
| Manufacturing Example 82 | S50 | AH18 | | |
| Manufacturing Example 83 | S51 | AH19 | | |
| Manufacturing Example 84 | S52 | AH20 | | |
| Manufacturing Example 85 | S53 | AH21 | | |
| Manufacturing Example 86 | S54 | AH22 | | |
| Manufacturing Example 87 | S55 | AH23 | | |
| Manufacturing Example 88 | S56 | AH24 | | |
| Manufacturing Example 89 | S57 | AH25 | | |
| Manufacturing Example 90 | S58 | AH26 | | |
| Manufacturing Example 91 | S59 | AH27 | | |
| Manufacturing Example 92 | S60 | AH28 | | |
| Manufacturing Example 93 | S61 | AH29 | | |
| Manufacturing Example 94 | S62 | AH30 | | |
| Manufacturing Example 95 | S63 | AH31 | | |
| Manufacturing Example 96 | S64 | AH32 | | |

Manufacturing Example 97 (Adjustment of Rework Solvent)

Into a reaction kettle equipped with a stirrer, 30 g of monoethanolamine, 30 g of DMM, and 30 g of N-methyl-2-pyrrolidone were charged, and stirred at room temperature for 1 hour to give a rework solvent.

Example 1

To an 8-inch silicon substrate (manufactured by Shin-Etsu Chemical Co., Ltd.) having a thickness of 750 μm, the resin composition (AH1) obtained in Manufacturing Example 1 was applied using a spin coater with adjusting the rotation speed so that the thickness after drying was 20 μm, heat-treated at 120° C. for 10 minutes to be dried, and then heat-treated at 200° C. for 3 minutes to be cured, whereby a resin composition-laminated silicon substrate was obtained.

An 8-inch alkali-free glass substrate (manufactured by Corning Incorporated) having a thickness of 0.7 mm was placed over the resin composition-laminated silicon substrate produced by the above method, and the substrates were pressure-bonded at a pressure of 0.5 MPa for 5 minutes using a hot press with the upper plate and the lower plate each set at 180° C. to give a glass substrate-laminated silicon substrate. Using the obtained glass substrate-laminated silicon substrate, adhesiveness evaluation, protrusion evaluation, heat resistance evaluation after adhesiveness evaluation, back grinding evaluation of the silicon substrate, heat resistance evaluation after back grinding evaluation, peeling evaluation, and rework evaluation were carried out, and the results are summarized in Table 5.

Examples 2 to 30

A glass substrate-laminated silicon substrate was obtained in the same manner as in Example 1 except that the resin composition was changed as shown in Table 5.

Using the obtained glass substrate-laminated silicon substrate, adhesiveness evaluation, protrusion evaluation, heat resistance evaluation after adhesiveness evaluation, back grinding evaluation of the silicon substrate, heat resistance evaluation after back grinding evaluation, peeling evaluation, and rework evaluation were carried out, and the results are summarized in Table 5.

Comparative Examples 1 and 2

A glass substrate-laminated silicon substrate was obtained in the same manner as in Example 1 except that the resin composition was changed as shown in Table 5.

Using the obtained glass substrate-laminated silicon substrate, adhesiveness evaluation, protrusion evaluation, heat resistance evaluation after adhesiveness evaluation, back grinding evaluation of the silicon substrate, heat resistance evaluation after back grinding evaluation, peeling evaluation, and rework evaluation were carried out, and the results are summarized in Table 5.

Example 31

The protective film layer of the laminated film (S1) obtained in Manufacturing Example 33 was peeled off, and then the laminated film was laminated on an 8-inch silicon substrate (manufactured by Shin-Etsu Chemical Co., Ltd.) using a vacuum laminator VTM-200M (manufactured by Takatori Corporation) so that the resin layer would come into contact with the silicon substrate. The lamination conditions were as follows: a heater temperature of 100° C., a roll temperature of 100° C., a lamination speed of 5 mm/sec, a lamination roll pressure of 0.2 MPa, and a chamber pressure of 150 Pa. The support film layer of the obtained laminate was peeled off to give a resin composition-laminated silicon substrate. The resin composition-laminated silicon substrate was cured by heat treatment at 200° C. for 3 minutes, and then the resin composition-laminated silicon substrate and another 8-inch alkali-free glass substrate (manufactured by Corning Incorporated) were stacked together so that the 8-inch alkali-free glass substrate was in contact with the resin layer, and the substrates were pressure-bonded at a pressure of 0.5 MPa for 5 minutes using a hot press with the upper plate and the lower plate each set at 180° C. to give a glass substrate-laminated silicon substrate. Using the obtained glass substrate-laminated silicon substrate, adhesiveness evaluation, protrusion evaluation, heat resistance evaluation after adhesiveness evaluation, back grinding evaluation of the silicon substrate, heat resistance evaluation after back grinding evaluation, peeling

TABLE 5

|  | Resin composition | Adhesiveness evaluation | Protrusion evaluation | Heat resistance evaluation after adhesiveness evaluation | Back grinding evaluation | Heat resistance evaluation after back grinding evaluation | Evaluation of peeling | Rework evaluation |
| --- | --- | --- | --- | --- | --- | --- | --- | --- |
| Example 1 | AH1 | A | A | A | A | B | B2 | A |
| Example 2 | AH2 | A | A | A | A | A | B2 | A |
| Example 3 | AH3 | A | A | A | A | A | B2 | A |
| Example 4 | AH4 | A | A | A | A | A | B2 | A |
| Example 5 | AH5 | A | A | A | A | A | B2 | B |
| Example 6 | AH6 | A | A | A | A | A | B2 | A |
| Example 7 | AH7 | A | A | B | B | A | B2 | A |
| Example 8 | AH8 | A | A | A | B | A | B2 | A |
| Example 9 | AH9 | A | A | A | B | A | B2 | A |
| Example 10 | AH10 | A | A | A | B | A | B2 | A |
| Example 11 | AH11 | A | A | A | A | A | B2 | A |
| Example 12 | AH12 | B | A | A | B | A | B2 | A |
| Example 13 | AH13 | A | B | A | A | A | B2 | A |
| Example 14 | AH14 | A | A | A | A | A | B2 | A |
| Example 15 | AH15 | A | A | A | A | A | B2 | A |
| Example 16 | AH16 | A | A | A | A | A | B2 | A |
| Example 17 | AH17 | A | A | A | A | A | B2 | A |
| Example 18 | AH18 | A | A | A | A | A | B2 | A |
| Example 19 | AH19 | A | A | A | A | A | B2 | A |
| Example 20 | AH20 | A | A | A | A | B | B2 | A |
| Example 21 | AH21 | A | A | A | A | A | B2 | A |
| Example 22 | AH22 | A | A | A | A | A | B2 | A |
| Example 23 | AH23 | A | A | A | A | A | A | A |
| Example 24 | AH24 | A | A | A | A | A | A | A |
| Example 25 | AH25 | A | A | A | A | A | A | A |
| Example 26 | AH26 | B | A | A | B | A | A | A |
| Example 27 | AH27 | A | A | A | B | A | A | A |
| Example 28 | AH28 | A | A | A | A | A | A | A |
| Example 29 | AH29 | A | A | A | A | A | A | A |
| Example 30 | AH30 | A | A | A | A | A | A | A |
| Comparative Example 1 | AH31 | A | A | A | A | D | B2 | A |
| Comparative Example 2 | AH32 | A | A | A | D | D | B2 | A | evaluation, and rework evaluation were carried out, and the results are summarized in Table 6.

Examples 32 to 60

A glass substrate-laminated silicon substrate was obtained in the same manner as in Example 31 except that the laminated film was changed as shown in Table 6.

Using the obtained glass substrate-laminated silicon substrate, adhesiveness evaluation, protrusion evaluation, heat resistance evaluation after adhesiveness evaluation, back grinding evaluation of the silicon substrate, heat resistance evaluation after back grinding evaluation, peeling evaluation, and rework evaluation were carried out, and the results are summarized in Table 6.

Comparative Examples 3 and 4

A glass substrate-laminated silicon substrate was obtained in the same manner as in Example 31 except that the laminated film was changed as shown in Table 6.

Using the obtained glass substrate-laminated silicon substrate, adhesiveness evaluation, protrusion evaluation, heat resistance evaluation after adhesiveness evaluation, back grinding evaluation of the silicon substrate, heat resistance evaluation after back grinding evaluation, peeling evaluation, and rework evaluation were carried out, and the results are summarized in Table 6.

Example 61

The protective film layer of the laminated film (S33) obtained in Manufacturing Example 65 was peeled off, and then the laminated film was laminated on an 8-inch silicon substrate (manufactured by Shin-Etsu Chemical Co., Ltd.) using a vacuum laminator VTM-200M (manufactured by Takatori Corporation) so that the resin layer would come into contact with the silicon substrate. The lamination conditions were as follows: a heater temperature of 100° C., a roll temperature of 100° C., a lamination speed of 5 mm/sec, a lamination roll pressure of 0.2 MPa, and a chamber pressure of 150 Pa. The obtained laminated substrate was pressure-bonded for 5 minutes at 0.5 MPa using a hot press with the upper plate and the lower plate each set at 180° C. to give a film-laminated silicon substrate. Using the obtained film-laminated silicon substrate, adhesiveness evaluation, protrusion evaluation, heat resistance evaluation after adhesiveness evaluation, back grinding evaluation of the silicon substrate, heat resistance evaluation after back grinding evaluation, peeling evaluation, and rework evaluation were carried out, and the results are summarized in Table 7.

Examples 62 to 90

A film laminated-silicon substrate was obtained in the same manner as in Example 61 except that the laminated film was changed as shown in Table 7.

TABLE 6

| | Laminated film | Resin composition | Adhesiveness evaluation | Protrusion evaluation | Heat resistance evaluation after adhesiveness evaluation | Back grinding evaluation | Heat resistance evaluation after back grinding evaluation | Evaluation of peeling | Rework evaluation |
|---|---|---|---|---|---|---|---|---|---|
| Example 31 | S1 | AH1 | A | A | A | A | B | B2 | A |
| Example 32 | S2 | AH2 | A | A | A | A | A | B2 | A |
| Example 33 | S3 | AH3 | A | A | A | A | A | B2 | A |
| Example 34 | S4 | AH4 | A | A | A | A | A | B2 | A |
| Example 35 | S5 | AH5 | A | A | A | A | A | B2 | B |
| Example 36 | S6 | AH6 | A | A | A | A | A | B2 | A |
| Example 37 | S7 | AH7 | A | A | B | B | A | B2 | A |
| Example 38 | S8 | AH8 | A | A | A | B | A | B2 | A |
| Example 39 | S9 | AH9 | A | A | A | B | A | B2 | A |
| Example 40 | S10 | AH10 | A | A | A | B | A | B2 | A |
| Example 41 | S11 | AH11 | A | A | A | A | A | B2 | A |
| Example 42 | S12 | AH12 | B | A | A | B | A | B2 | A |
| Example 43 | S13 | AH13 | A | B | A | A | A | B2 | A |
| Example 44 | S14 | AH14 | A | A | A | A | A | B2 | A |
| Example 45 | S15 | AH15 | A | A | A | A | A | B2 | A |
| Example 46 | S16 | AH16 | A | A | A | A | A | B2 | A |
| Example 47 | S17 | AH17 | A | A | A | A | A | B2 | A |
| Example 48 | S18 | AH18 | A | A | A | A | A | B2 | A |
| Example 49 | S19 | AH19 | A | A | A | A | A | B2 | A |
| Example 50 | S20 | AH20 | A | A | A | A | B | B2 | A |
| Example 51 | S21 | AH21 | A | A | A | A | A | B2 | A |
| Example 52 | S22 | AH22 | A | A | A | A | A | B2 | A |
| Example 53 | S23 | AH23 | A | A | A | A | A | A | A |
| Example 54 | S24 | AH24 | A | A | A | A | A | A | A |
| Example 55 | S25 | AH25 | A | A | A | A | A | A | A |
| Example 56 | S26 | AH26 | B | A | A | B | A | A | A |
| Example 57 | S27 | AH27 | A | A | A | B | A | A | A |
| Example 58 | S28 | AH28 | A | A | A | A | A | A | A |
| Example 59 | S29 | AH29 | A | A | A | A | A | A | A |
| Example 60 | S30 | AH30 | A | A | A | A | A | A | A |
| Comparative Example 3 | S31 | AH31 | A | A | A | A | D | B2 | A |
| Comparative Example 4 | S32 | AH32 | A | A | A | D | D | B2 | A |

Using the obtained film-laminated silicon-substrate, adhesiveness evaluation, protrusion evaluation, heat resistance evaluation after adhesiveness evaluation, back grinding evaluation of the silicon substrate, heat resistance evaluation after back grinding evaluation, peeling evaluation, and rework evaluation were carried out, and the results are summarized in Table 7.

Comparative Examples 5 and 6

A film laminated-silicon substrate was obtained in the same manner as in Example 61 except that the laminated film was changed as shown in Table 7.

Using the obtained film-laminated silicon substrate, adhesiveness evaluation, protrusion evaluation, heat resistance evaluation after adhesiveness evaluation, back grinding evaluation of the silicon substrate, heat resistance evaluation after back grinding evaluation, peeling evaluation, and rework evaluation were carried out, and the results are summarized in Table 7.

The invention claimed is:

1. A resin composition comprising at least (a) a polyimide resin having a structure represented by the general formula (1):

[Chemical Formula 1]

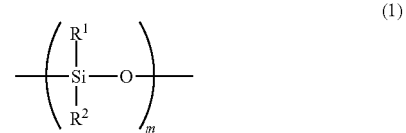

wherein m is a natural number of 1 or more and 100 or less, $R^1$ and $R^2$ may be same or different and each represent an alkyl group having 1 to 30 carbon atoms, a phenyl group or a phenoxy group, (b) a crosslinker including a fluorene group; and
(c) a siloxane polymer represented by the general formula (6):

TABLE 7

|  | Laminated film | Resin composition | Adhesiveness evaluation | Protrusion evaluation | Heat resistance evaluation after adhesiveness evaluation | Back grinding evaluation | Heat resistance evaluation after back grinding evaluation | Evaluation of peeling | Rework evaluation |
|---|---|---|---|---|---|---|---|---|---|
| Example 61 | S33 | AH1 | A | A | A | A | B | c | — |
| Example 62 | S34 | AH2 | A | A | A | A | A | c | — |
| Example 63 | S35 | AH3 | A | A | A | A | A | c | — |
| Example 64 | S36 | AH4 | A | A | A | A | A | c | — |
| Example 65 | S37 | AH5 | A | A | A | A | A | c | — |
| Example 66 | S38 | AH6 | A | A | A | A | A | c | — |
| Example 67 | S39 | AH7 | A | A | B | B | A | c | — |
| Example 68 | S40 | AH8 | A | A | A | B | A | c | — |
| Example 69 | S41 | AH9 | A | A | A | B | A | c | — |
| Example 70 | S42 | AH10 | A | A | A | B | A | c | — |
| Example 71 | S43 | AH11 | A | A | A | A | A | c | — |
| Example 72 | S44 | AH12 | B | A | A | B | A | c | — |
| Example 73 | S45 | AH13 | A | B | A | A | A | c | — |
| Example 74 | S46 | AH14 | A | A | A | A | A | c | — |
| Example 75 | S47 | AH15 | A | A | A | A | A | c | — |
| Example 76 | S48 | AH16 | A | A | A | A | A | c | — |
| Example 77 | S49 | AH17 | A | A | A | A | A | c | — |
| Example 78 | S50 | AH18 | A | A | A | A | A | c | — |
| Example 79 | S51 | AH19 | A | A | A | A | A | c | — |
| Example 80 | S52 | AH20 | A | A | A | A | B | c | — |
| Example 81 | S53 | AH21 | A | A | A | A | A | c | — |
| Example 82 | S54 | AH22 | A | A | A | A | A | c | — |
| Example 83 | S55 | AH23 | A | A | A | A | A | a | A |
| Example 84 | S56 | AH24 | A | A | A | A | A | a | A |
| Example 85 | S57 | AH25 | A | A | A | A | A | a | A |
| Example 86 | S58 | AH26 | B | A | A | B | A | a | A |
| Example 87 | S59 | AH27 | A | A | A | B | A | a | A |
| Example 88 | S60 | AH28 | A | A | A | A | A | a | A |
| Example 89 | S61 | AH29 | A | A | A | A | A | a | A |
| Example 90 | S62 | AH30 | A | A | A | A | A | a | A |
| Comparative Example 5 | S63 | AH31 | A | A | A | A | D | c | — |
| Comparative Example 6 | S64 | AH32 | A | A | A | D | D | c | — |

[Chemical Formula 2]

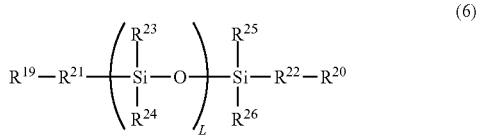

(6)

wherein L is an integer of 10 or more and 100 or less, $R^{19}$ and $R^{20}$ may be same or different and each represent a monovalent organic group having 1 to 30 carbon atoms and 0 to 3 nitrogen atoms, $R^{21}$ and $R^{22}$ may be same or different and each represent an alkylene group having 1 to 30 carbon atoms or a phenylene group, $R^{23}$ to $R^{26}$ may be same or different and each represent an alkyl group having 1 to 30 carbon atoms, an alkoxy group, a phenyl group, or a phenoxy group, and an alkoxy group having 1 to 30 carbon atoms, and wherein $R^{23}$ to $R^{26}$ does not include a polyoxyalkylene structure.

2. The resin composition according to claim 1, wherein the crosslinker (b) including a fluorene group is an epoxy resin including a fluorene group.

3. The resin composition according to claim 1, wherein the crosslinker (b) including a fluorene group has a 5% weight loss temperature of 250° C. or more and 400° C. or less.

4. The resin composition according to claim 1, having a content of the crosslinker (b) including a fluorene group of 0.1% by mass or more and 40% by mass or less relative to 100% by mass of the polyimide resin (a).

5. The resin composition according to claim 1, wherein $R^{19}$ and $R^{20}$ of the siloxane polymer (c) represented by the general formula (6) are amino groups.

6. The resin composition according to claim 1, having a content of the siloxane polymer (c) represented by the general formula (6) of 0.01% by mass or more and 30% by mass or less relative to 100% by mass of the polyimide resin (a) having a structure represented by the general formula (1).

7. The resin composition according to claim 1, further comprising (d) a silane coupling agent.

8. The resin composition according to claim 7, having a content of the silane coupling agent (d) of 0.01% by mass or more and 30% by mass or less relative to 100% by mass of the polyimide resin (a) having a structure represented by the general formula (1).

9. The resin composition according to claim 1, further comprising (e) inorganic fine particles.

10. The resin composition according to claim 9, having a content of the inorganic fine particles (e) of 0.1% by mass or more and 40% by mass or less relative to 100% by mass of the polyimide resin (a).

11. The resin composition according to claim 1, having a glass transition temperature after curing of 30° C. or more and 150° C. or less.

12. A resin layer comprising a coating film of the resin composition according to claim 1.

13. A permanent adhesive comprising the resin composition according to claim 1.

14. An adhesive for temporary bonding comprising the resin composition according to claim 1.

15. The adhesive for temporary bonding according to claim 14, for bonding an electronic circuit formation substrate or a semiconductor circuit formation substrate and a support substrate together.

16. The adhesive for temporary bonding according to claim 15, wherein the support substrate is any of a silicon substrate, a glass substrate, and a film.

17. A method for manufacturing an electronic component or a semiconductor device using the resin composition according to claim 1.

18. A laminated film comprising a heat-resistant insulating film and the resin composition according to claim 1 laminated on at least one surface of the heat-resistant insulating film.

19. The laminated film according to claim 18, wherein the heat-resistant insulating film has a release-treated surface.

20. The laminated film according to claim 18, further comprising a film having a release-treated surface laminated on a surface of the resin composition laminated on the heat-resistant insulating film.

21. A processed wafer comprising an electronic circuit formation substrate or a semiconductor circuit formation substrate and a support substrate bonded together with at least a resin layer comprising a coating film of the resin composition according to claim 1.

22. The processed wafer according to claim 21, wherein the electronic circuit formation substrate or the semiconductor circuit formation substrate and the support substrate are bonded together with only the resin layer or only the laminated film interposed between the electronic circuit formation substrate or the semiconductor circuit formation substrate and the support substrate.

23. The processed wafer according to claim 21, wherein the electronic circuit formation substrate or the semiconductor circuit formation substrate has a thickness of 1 µm or more and 100 µm or less.

24. A method for manufacturing an electronic component or a semiconductor device using the processed wafer according to claim 21, the method comprising at least either of the steps of:
  heat-treating the electronic circuit formation substrate or the semiconductor circuit formation substrate in the processed wafer;
  peeling the electronic circuit formation substrate or the semiconductor circuit formation substrate in the processed wafer from the support substrate; and
  washing the resin layer attached to the electronic circuit formation substrate or the semiconductor circuit formation substrate peeled from the processed wafer or the resin layer attached to the support substrate in the processed wafer with a solvent.

25. The method for manufacturing an electronic component or a semiconductor device according to claim 24, comprising the step of heat-treating the electronic circuit formation substrate or the semiconductor circuit formation substrate in the processed wafer at a temperature of 230° C. or more and 450° C. or less.

* * * * *